United States Patent
Liang et al.

(10) Patent No.: US 8,297,341 B2
(45) Date of Patent: Oct. 30, 2012

(54) HEAT DISSIPATING STRUCTURE AND METHOD OF FORMING THE SAME

(75) Inventors: Ting Wei Liang, Hsinchu (TW); Min Jui Wu, Hsinchu (TW)

(73) Assignee: Getac Technology Corp., Taipei (TW)

( * ) Notice: Subject to any disclaimer, the term of this patent is extended or adjusted under 35 U.S.C. 154(b) by 984 days.

(21) Appl. No.: 12/206,579

(22) Filed: Sep. 8, 2008

(65) Prior Publication Data
US 2010/0059213 A1    Mar. 11, 2010

(51) Int. Cl.
F28F 7/00    (2006.01)
H05K 7/20    (2006.01)

(52) U.S. Cl. .................. 165/80.3; 165/185; 361/690

(58) Field of Classification Search ............... 165/80.3, 165/185; 361/690
See application file for complete search history.

(56) References Cited

U.S. PATENT DOCUMENTS

| | | | | |
|---|---|---|---|---|
| 3,035,416 A | * | 5/1962 | Wagner | 62/3.2 |
| 3,242,984 A | * | 3/1966 | Pelce et al. | 165/185 |
| 4,605,058 A | * | 8/1986 | Wilens | 165/80.2 |
| 4,729,426 A | * | 3/1988 | Hinshaw | 165/80.3 |
| 5,894,882 A | * | 4/1999 | Kikuchi et al. | 165/80.3 |
| 6,082,440 A | * | 7/2000 | Clemens et al. | 165/80.3 |
| 6,101,091 A | * | 8/2000 | Baik | 361/704 |
| 6,101,093 A | * | 8/2000 | Wong et al. | 361/709 |
| 6,141,220 A | | 10/2000 | Lin | |
| 6,161,610 A | * | 12/2000 | Azar | 165/80.3 |
| 6,267,178 B1 | * | 7/2001 | Chen | 165/185 |
| 6,397,935 B1 | * | 6/2002 | Yamamoto et al. | 165/104.26 |
| 6,460,609 B1 | * | 10/2002 | Cho et al. | 165/80.3 |
| D474,754 S | * | 5/2003 | Tan et al. | D13/179 |
| 6,615,909 B2 | * | 9/2003 | Fast | 165/80.3 |
| 6,615,910 B1 | * | 9/2003 | Joshi et al. | 165/80.3 |
| 6,992,889 B1 | * | 1/2006 | Kashiwagi et al. | 361/700 |
| 7,124,808 B2 | * | 10/2006 | Liu | 165/80.3 |
| 7,128,132 B2 | * | 10/2006 | Kao et al. | 165/80.3 |

(Continued)

FOREIGN PATENT DOCUMENTS

DE    202007001266 U1    7/2007
WO    2004/025203 A2    3/2004

OTHER PUBLICATIONS

German Patent Office Communication.

*Primary Examiner* — Allen Flanigan
*Assistant Examiner* — Jason Thompson
(74) *Attorney, Agent, or Firm* — Apex Juris, pllc; Tracy M. Heims

(57) ABSTRACT

A forming method for a heat dissipating structure is provided. According to the method, an extrudate is formed by extrution molding, wherein the extrudate includes protruding bending portions extending in parallel. Fins are extruded monolithically on the bending portions. One or more cut channels are formed by cutting the fins and the extrudate with a cutting tool. The cutting tool cuts the fins for forming a notch on each fin at first, and then cuts the bending portions for forming a cut-through slot on each bending portion, wherein each cut-through slot is formed for cooling air flowing through two side of the extrudate. By cutting the bending portions and the fins by the cutting tool at the same time, a large number of cut-through slots are formed in despite of the existence of the fins, and the performance of heat dissipation is enhanced.

9 Claims, 25 Drawing Sheets

U.S. PATENT DOCUMENTS

| | | | |
|---|---|---|---|
| 7,139,171 B2* | 11/2006 | Wang et al. | 361/695 |
| 7,182,124 B2* | 2/2007 | Chen | 165/80.3 |
| 7,639,497 B2* | 12/2009 | Xu | 361/697 |
| 2002/0020523 A1* | 2/2002 | Sheu | 165/185 |
| 2002/0043362 A1* | 4/2002 | Wilson | 165/166 |
| 2002/0044424 A1 | 4/2002 | Hashimoto | |
| 2002/0075653 A1 | 6/2002 | Lin | |
| 2003/0164233 A1* | 9/2003 | Wu et al. | 165/166 |

* cited by examiner

HEAT DISSIPATING STRUCTURE AND METHOD OF FORMING THE SAME

BACKGROUND OF THE INVENTION

1. Field of the Invention

The present invention relates to heat dissipation, more particularly, to a heat dissipating structure formed by extrusion molding having enhanced air cooling performance.

2. Related Art

Referring to FIGS. 1A and 1B, an air-cooling heat dissipating structure 1 in the prior art is shown. The air-cooling heat dissipating structure 1 essentially includes a substrate 2 and fins 3 formed on the substrate 2. The substrate 2 is provided for contacting a heat source, or serves as a casing to enclose a heat generating member. An inner surface of the substrate 2 absorbs heat of a heat source 4 or a heat generating member 5 through heat conduction or heat convection, and an outer surface of the substrate 2 exchanges heat with ambient air to dissipate heat through heat convection. The fins 3 are disposed on the outer surface of the substrate 2 and arranged in parallel. The fins 3 are provided for increasing the total surface area for heat exchange, to enhance the heat convection performance of the air-cooling heat dissipation structure.

In general, the heat dissipating structure in the prior art is fabricated by various methods, such as machining, die casting, extrusion molding, and combination process. The extrusion molding method is widely applied to fabricate members of a uniform cross-sectional shape, due to its high production rate and simple processes. The extrusion molding method using aluminum or aluminum alloy with a relatively low melting point is also referred to as an aluminum extrusion molding method.

As aforementioned, the air-cooling heat dissipating structure is applied to serve as a casing to enclose a heat generating member. The heat generated by the heat generating member is indirectly dissipated outside through the air-cooling heat dissipating structure. The heat generating member is also directly cooled by air flowing into the casing to achieve an enhanced heat dissipation performance. In order to allow the circulation of the air flows, air vents formed on the casing are required to improve the air circulation effect.

However, the extrusion molding method can only be used to fabricate continuous structures having a uniform cross-sectional area. If the extruded direction of the extrusion molding is defined as a longitudinal direction, through-holes penetrating the extrudate in a direction perpendicular to the longitudinal direction cannot be formed by extrusion molding. If it is intended to form air vents by punching processing, the punching tool is unable to punch holes on the substrate 2 due to the fins 3 protruding from the heat dissipating structure 1. A drill bit can be used to drill holes on the substrate 2, but only one air vent can be done in each process. When the heat dissipating structure 1 must be studded with air vents, the use of a drill bit for drilling holes may require a lot of processing time, and thus fails to meet the demand on yield. Therefore, an enclosed casing fabricated by an extruded heat dissipating structure can only introduce cooling air flows in and exhaust hot air out through the air vents opened on the front and rear panels thereof, so that it is difficult to promote the circulation of the cooling air flows to enhance the air-cooling effect.

SUMMARY OF THE INVENTION

In the prior art, the problem that the existence of the fins causes difficulties on rapidly producing ventilated structures. By forming cut channels, the present invention rapidly forms massive cut through slots on a heat dissipating structure that has fins extended outward, thereby enhancing the air-cooling efficiency of the heat dissipating structure.

In one aspect of the present invention, a heat dissipating structure comprises an extrudate, multiple fins and one or more cut channel. The extrudate includes multiple protruding bent portions extending externally in parallel. The fins extend in parallel with the bent portions. One or more of the fins is disposed on one of the bent portions. The cut channel includes an notch forming on at least one of the fins and a cut-through slot forming on at least one of the bent portions; wherein the notch and the cut-through slot of the cut channel are coplanar.

In another aspect of the present invention, a method of forming a heat dissipating structure comprises the following steps. First of all, extrude a heat dissipating structure including multiple bent portions and multiple fins. The bent portions protrude outward and are in parallel with the fins. One or more of the fins is disposed on one of the bent portions of the heat dissipating structure. Then, cut the heat dissipating structure to form one or more cut channel. The cut channel includes an notch forming on one or more of the fins and a cut-through slot forming on one or more of the bent portions. It is to be disclosed be the present invention that the notch and the cut-through slot of the cut channel are coplanar.

These and other features, aspects, and advantages of the present invention will become better understood with reference to the following description and appended claims. It is to be understood that both the foregoing general description and the following detailed description are examples, and are intended to provide further explanation of the invention as claimed.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE PREFERRED EMBODIMENTS

Figure 1A:
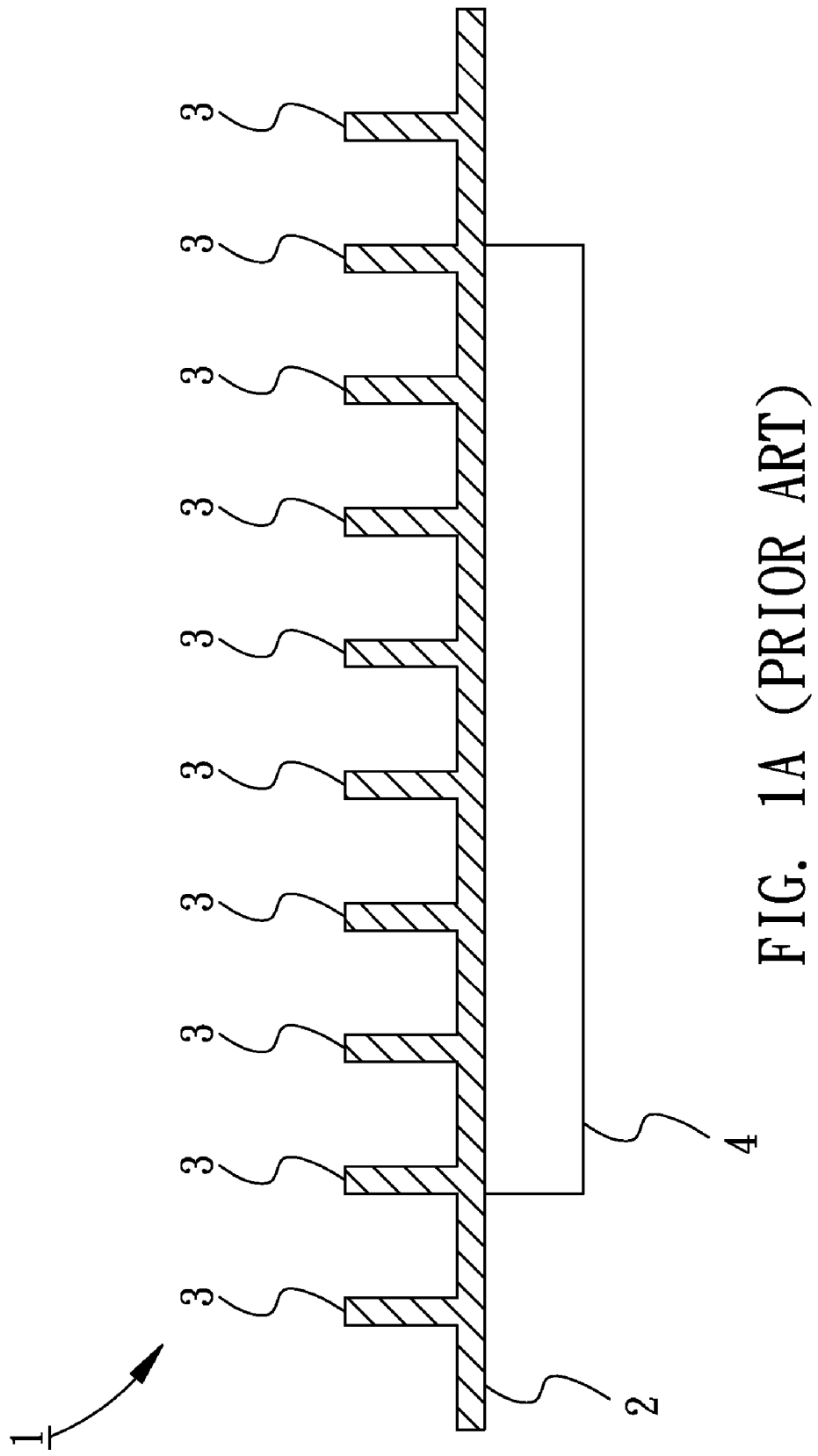
FIG. 1A is a cross-sectional view of a heat dissipating structure in the prior art.
Figure 1B:
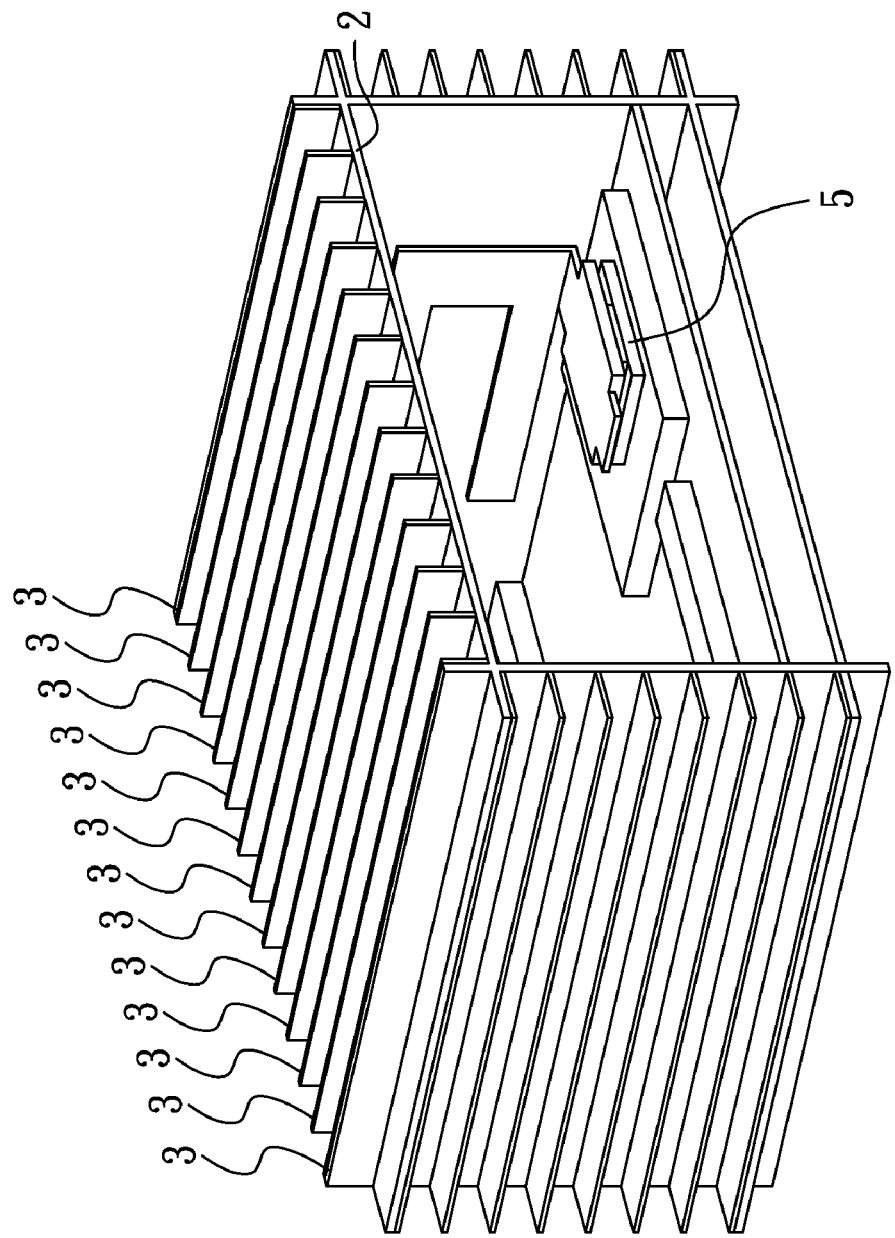
FIG. 1B is a perspective view of a heat dissipating structure in the prior art.

Reference will now be made in detail to the present preferred embodiments of the invention, examples of which are illustrated in the accompanying drawings. Wherever possible, the same reference numbers are used in the drawings and the description refers to the same or the like parts.

Figure 2:
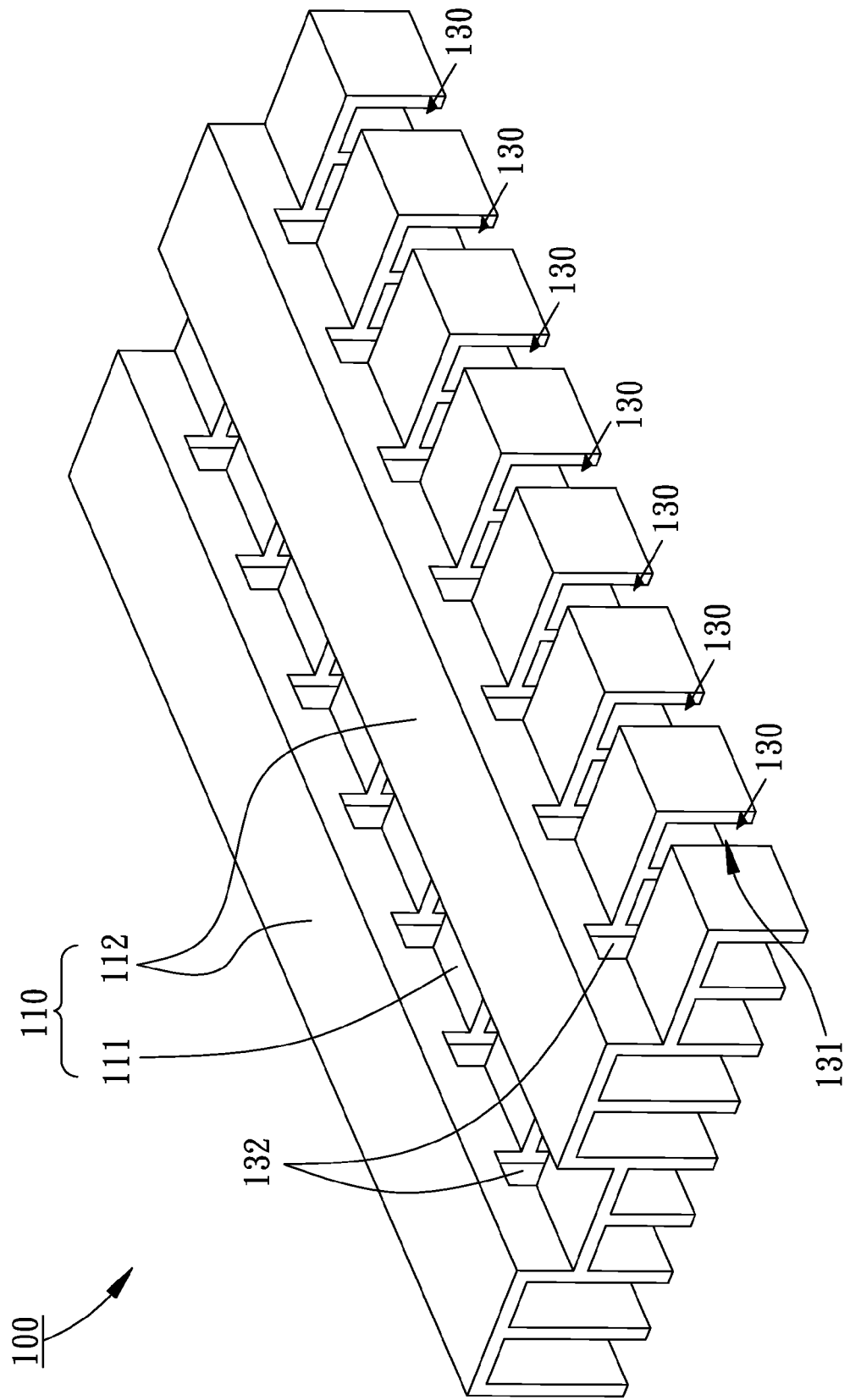
FIGS. 2 and 3 are perspective views of a heat dissipating structure according to a first embodiment of the present invention.
Figure 3:
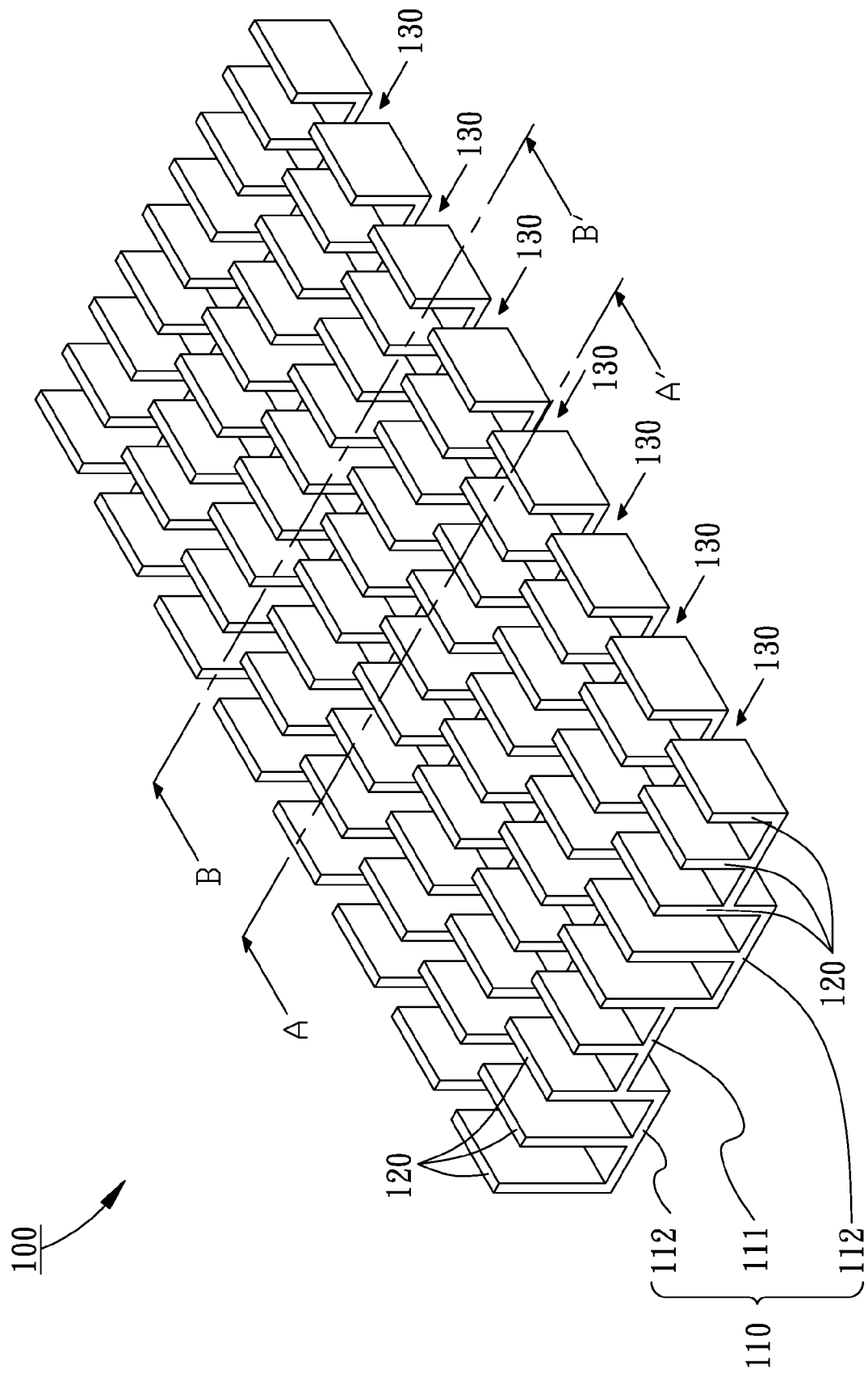
Figure 4:
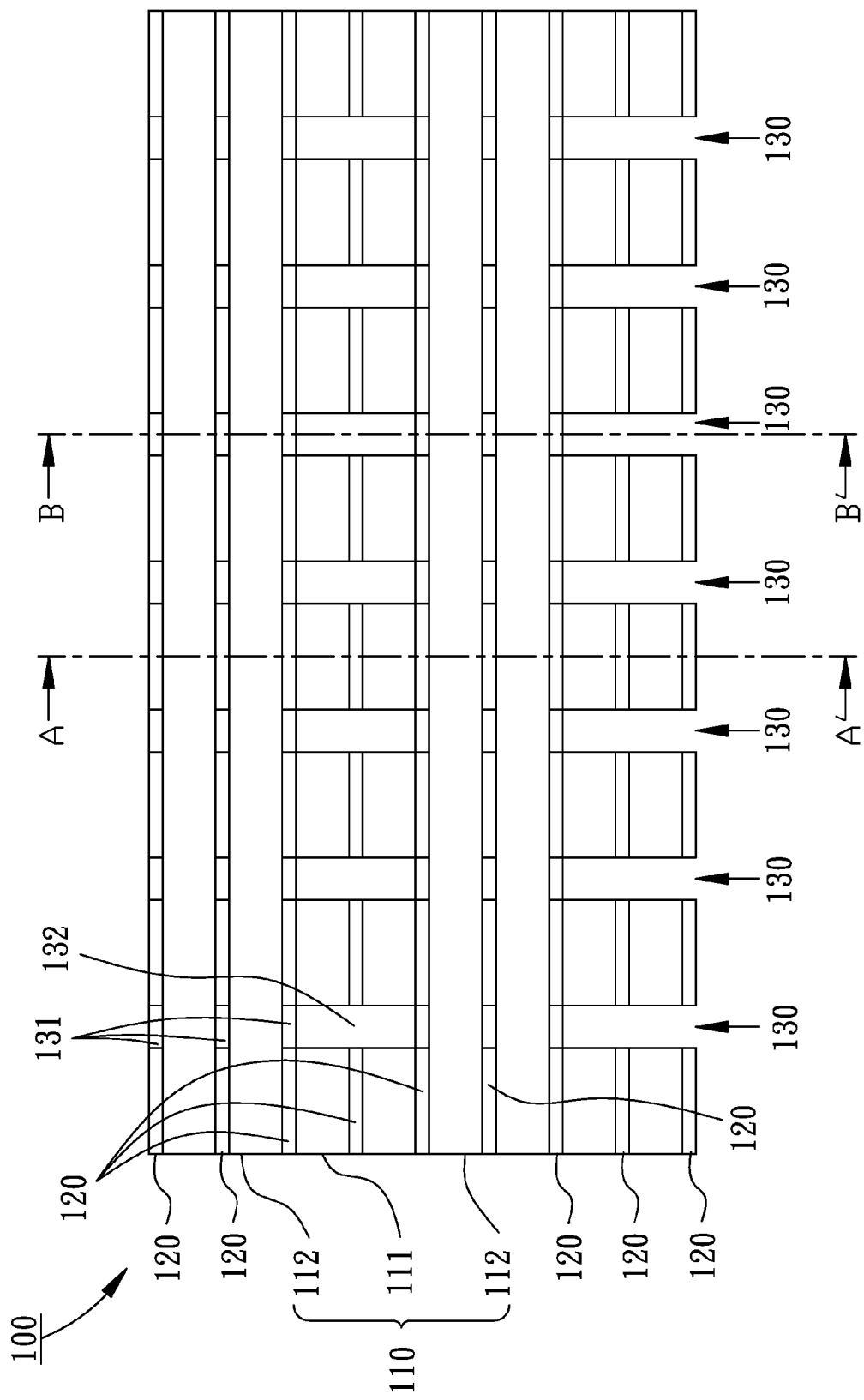
FIG. 4 is a top view of the heat dissipating structure according to the first embodiment of the present invention.

Referring to FIGS. 2, 3, and 4, a heat dissipating structure 100 according to a first embodiment of the present invention is shown. The heat dissipating structure 100 includes an extrudate 110 and a plurality of fins 120, wherein the extrudate 110 and the fins 120 are formed monolithically by extrusion molding, and cooling air can flow through the extrudate 110 to enhance the air-cooling effect.

Figure 5A:
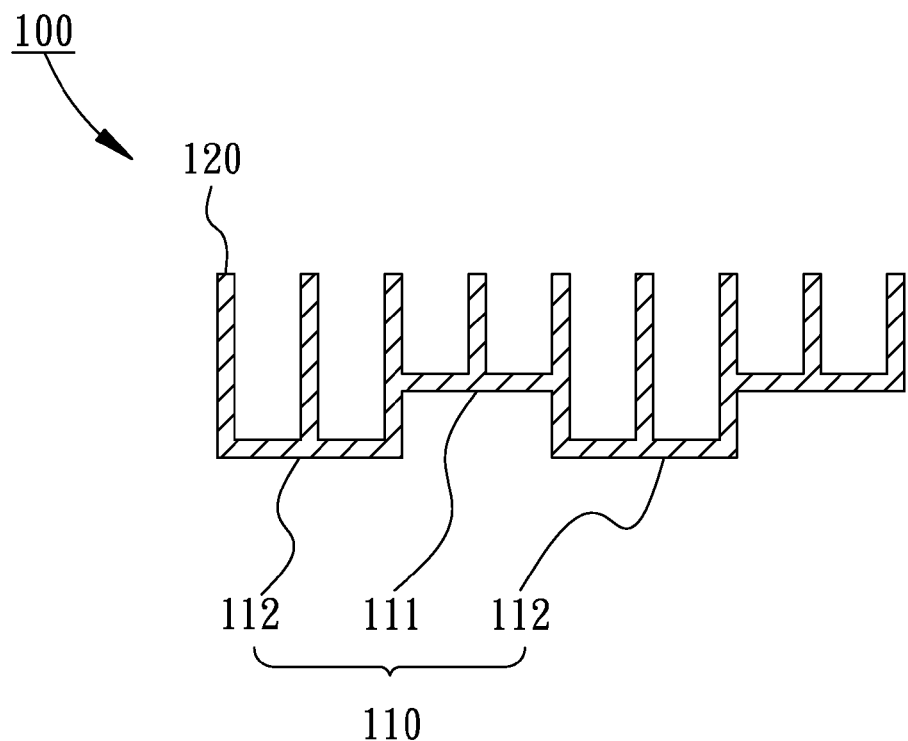
FIG. 5A is a cross-sectional view along line A-A' in FIGS. 3 and 4.

FIG. 5A is a cross-sectional view along line A-A' in FIGS. 3 and 4. As shown in FIG. 5A, the extrudate 110 is formed by extrusion molding, the extrudate 110 can be a single sheet or a tubular structure. The extrudate 110 includes a plurality of bent portions 111 and a plurality of connecting portions 112 disposed alternately, and the bent portions 111 and connecting portions 112 extend in a longitudinal direction of the extrudate. The connecting portions 112 are provided for connecting the adjacent bent portions 111, and the bent portions 111 protrude from a surface of the extrudate 110. Since the extrudate 110 is formed by the extrusion molding, the bent portions 111 extend in parallel along the longitudinal direction of the extrudate 110. The aforementioned longitudinal direction is a direction which the extrudate 110 is extruded along in the extrusion molding.

Referring to FIG. 5A, the extrudate 110 and the fins 120 are simultaneously formed by the extrusion molding, wherein the fins 120 are monolithically formed on an outer surface of the extrudate 110. The fins 20 increase the total surface area for heat dissipation of the heat dissipating structure. Since the fins 120 are formed bye extrusion molding and extruded along the longitudinal direction, the fins 120 continuously extend in parallel with the bent portions 111 and the connecting portions 112. The fins 120 are respectively disposed on the bent portions 111 and the connecting portions 112.

Figure 5B:
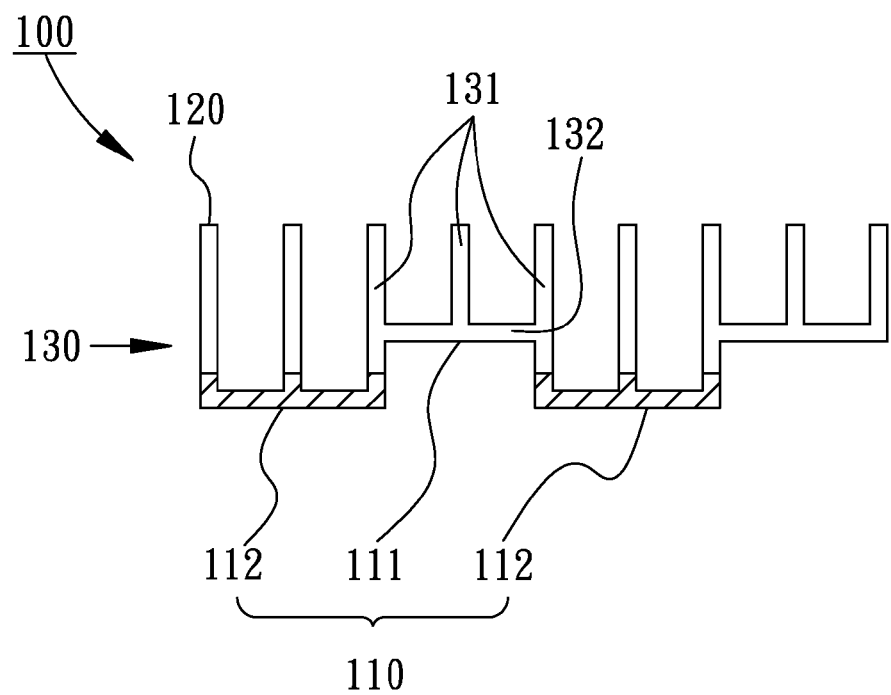
FIG. 5B is a cross-sectional view along line B-B' in FIGS. 3 and 4.

FIG. 5B is a cross-sectional view along line B-B' in FIGS. 3 and 4. As shown in FIG. 5B, after monolithically forming the extrudate 110 and the fins 120 by extrusion, a cutting process is performed. The extrudate 110 and the fins 120 of the heat dissipating structure 100 are cut by a cutting tool 900 to form a plurality of cut channels 130. The cutting direction of the cut channel 130 males an angle with respect to the longitudinal direction of the extrudate 110, namely, the cutting direction is not in parallel with the longitudinal direction of the extrudate 110. Each cut channel 130 respectively forms an notch 131 on each fin 120 and meanwhile form a cut-through slot 132 on each bent portion 111.

Figure 6A:
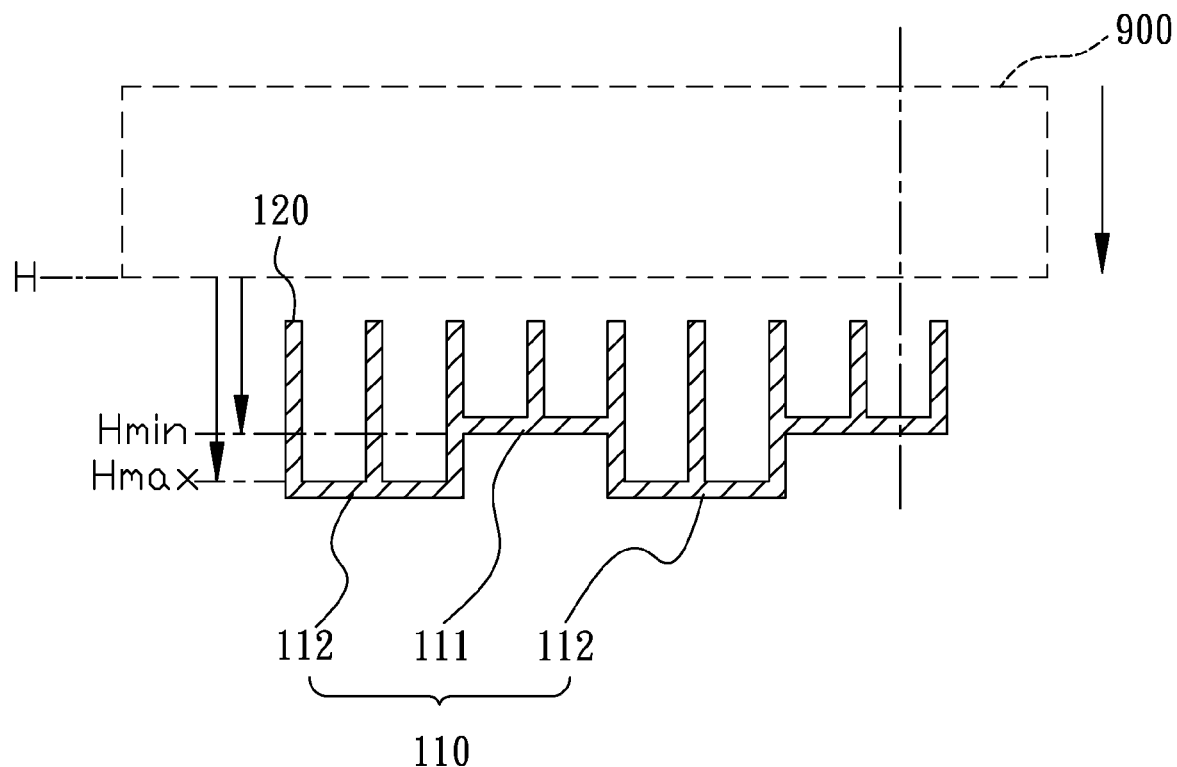
FIGS. 6A, 6B, and 6C are cross-sectional views of the first embodiment of the present invention, showing steps of forming the heat dissipating structure.
Figure 6B:
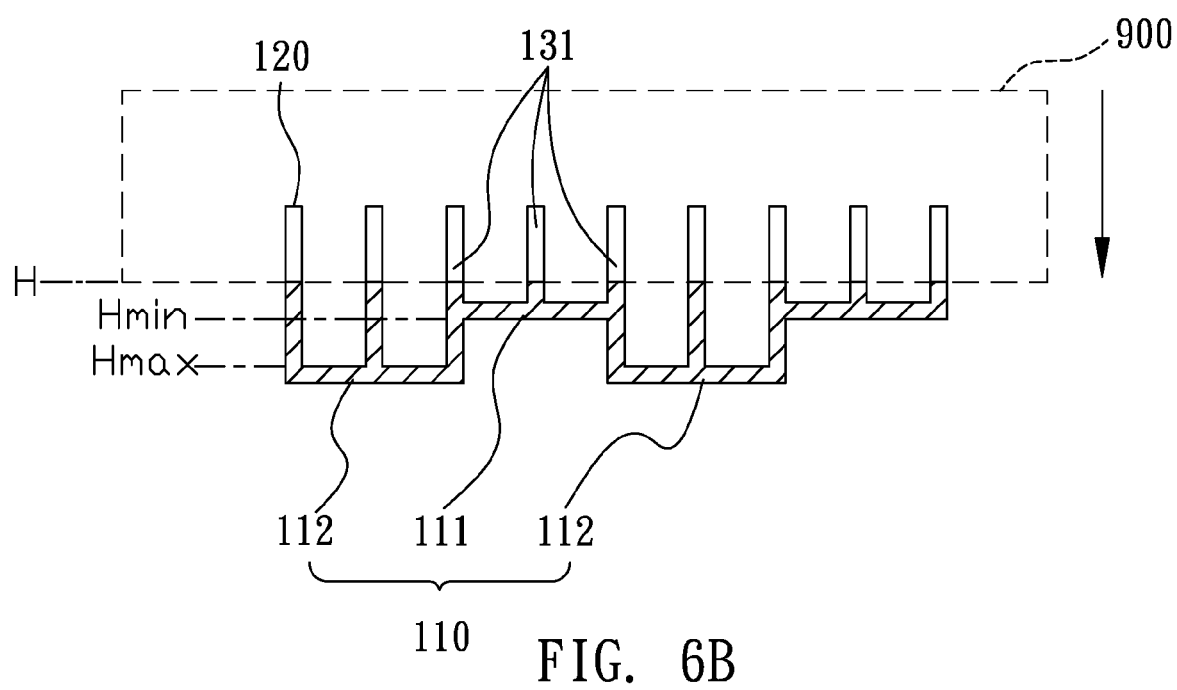
Figure 6C:
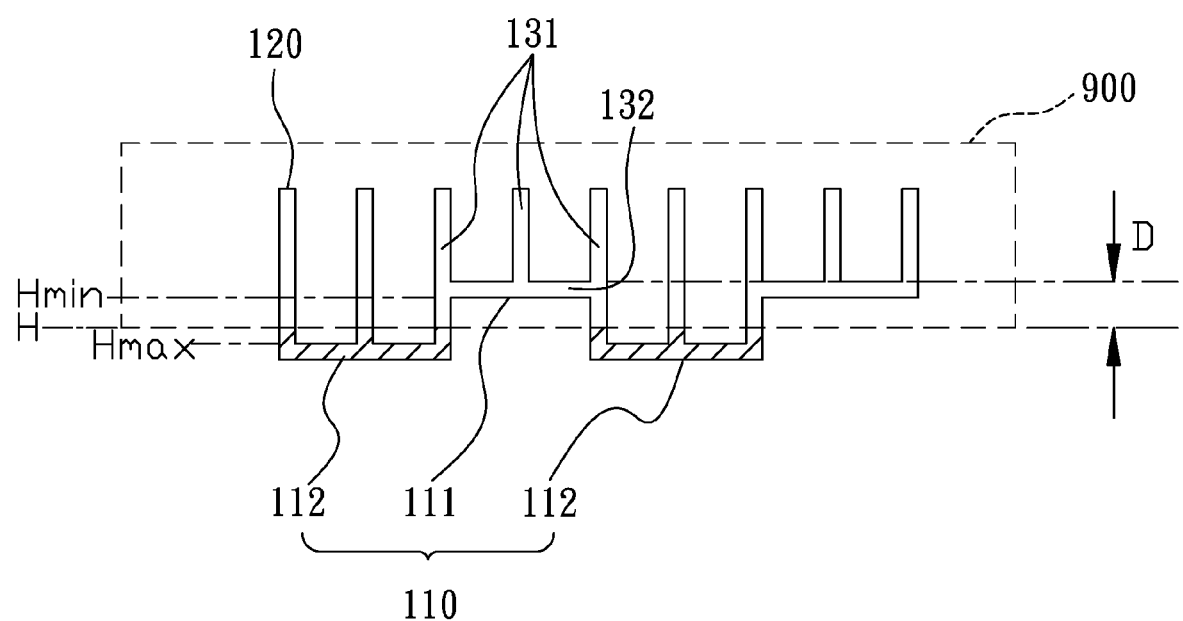

Referring to FIGS. 6A, 6B, and 6C, each cut channel 130 is formed by the cutting tool 900 cutting in a straight line with a gradually increasing cutting depth D, wherein the cutting depth D is the feed travel of the cutting tool 900 toward the extrudate 110. In each cut channel 130, the notch 131 and the cut-through slot 132 are formed by a single motion of the same cutting tool 900, so that the notch 131 and the cut-through slot 132 are coplanar. As the fins 120 are formed on the surface of the extrudate 110 and with front edges located outside the top edges of the bent portions 111, the cutting tool 900 will cut the fins 120 in advance when fed toward the surface of the extrudate 110, thus forming the notches 131 on the fins 120.

Then, the cutting tool 900 is brought into contact with the top edges of the bent portions 111 and cuts the bent portions 111, so as to form the cut-through slots 132 on the bent portions 111. The feed travel from the point that the cutting tool 900 is brought into contact with the top edges of the bent portions 111 to a point that the feeding of the cutting tool 900 is stopped is regarded as the cutting depth D. Such a cutting depth D is also equal to a distance from the outermost to the innermost edge of the cut-through slot 132. In order to prevent the cut channels 130 formed by the cutting tool 900 from cutting off the extrudate 110, junctions between the adjacent bent portions 111 are required to reserved. In this embodiment, the junctions between the adjacent bent portions 111 are the connecting portions 112, such that the cutting tool 900 may not cut off the connecting portions 112. That is, the cutting depth D of each cut-through slot 132 is smaller than the height of the bent portion 111 protruding from the connecting portion 112, so as to prevent the connecting portion 112 from being cut off by the cutting tool 900.

If bottom edges of the cut channels 130 are defined as cutting lines, a minimum cutting line Hmin can be defined at the highest point of the inner side faces of the bent portions 111, and a maximum cutting line Hmax can be defined on the top faces of the connecting portions 112. Cutting lines formed by the cutting tool 900 on the extrudate 110 lie between the minimum cutting line Hmin and the maximum cutting line Hmax, such that the cut-through slots 132 can be formed by the cutting tool 900 on the bent portions 111 without cutting off the connecting portions 112.

The cut channels 130 are formed by the single cutting tool 900 to rapidly form the cut-through slots 132 on the extrudate 110 for the cooling air flows to pass through. Since, the cooling air flows can quickly flow through the extrudate 110, the convection heat transfer is enhanced.

Figure 7:
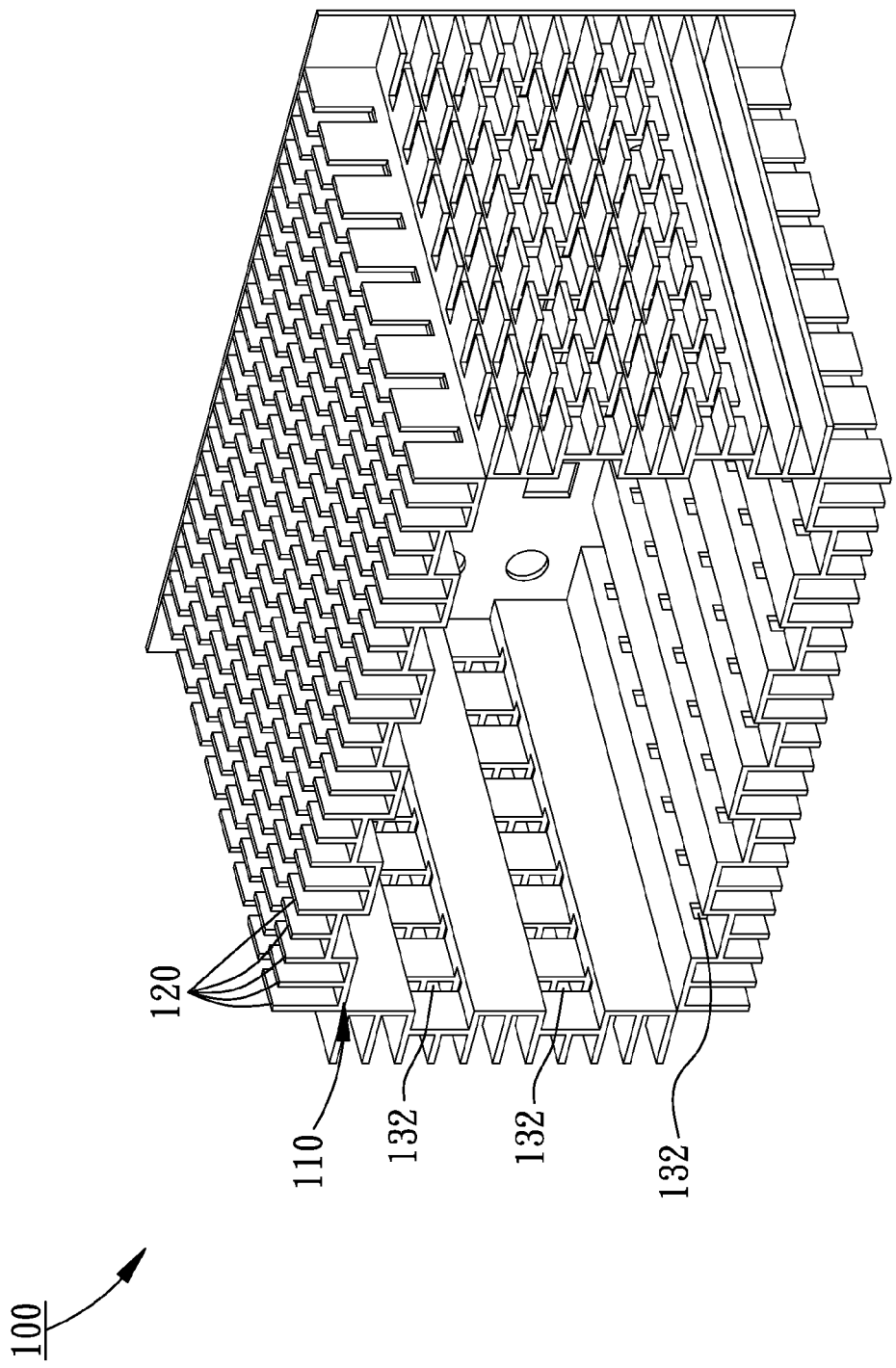
FIG. 7 is a perspective view of a casing formed according to the first embodiment of the present invention.
Figure 8:
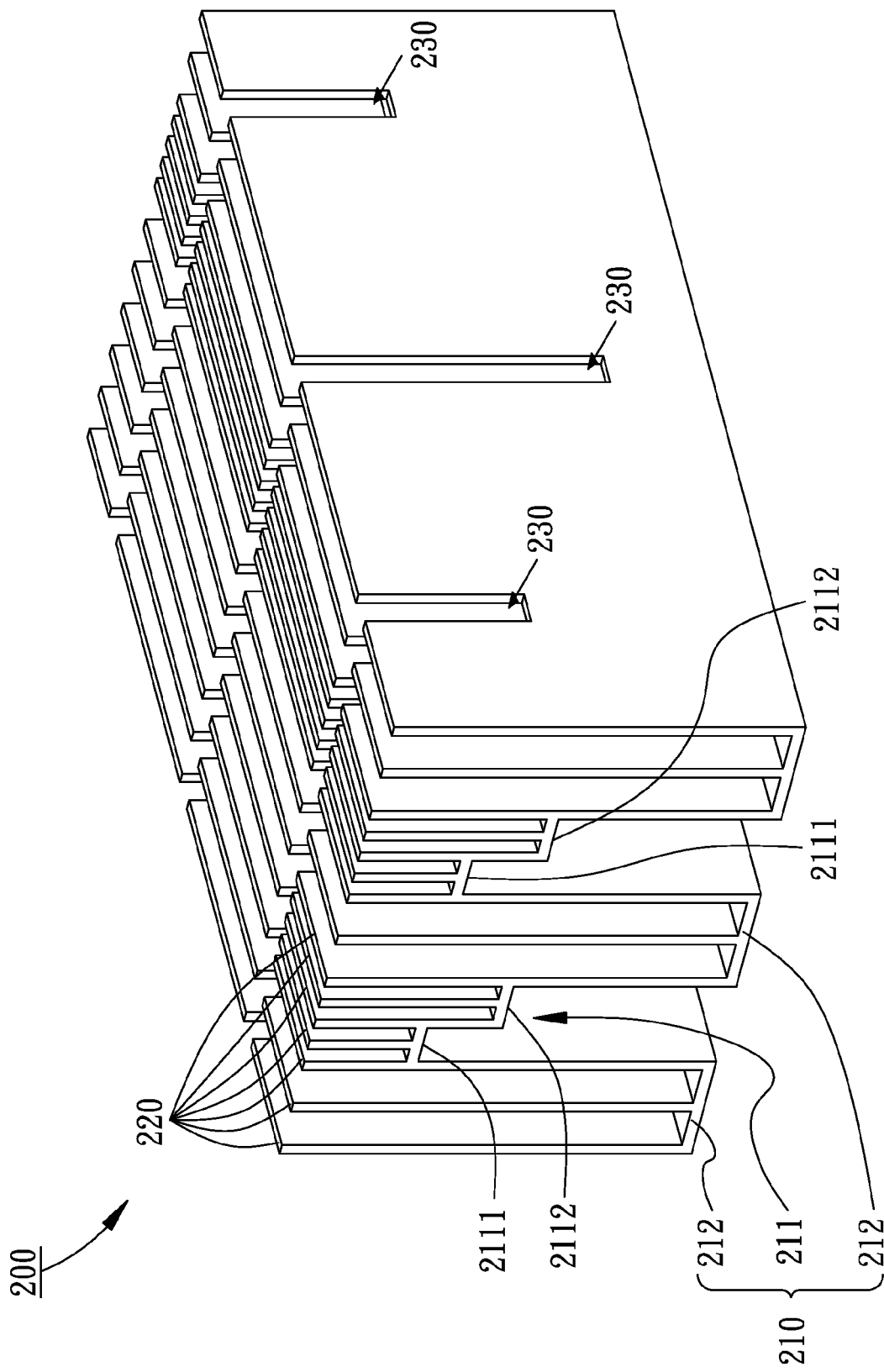
FIGS. 8 and 9 are perspective views of a heat dissipating structure according to a second embodiment of the present invention.
Figure 9:
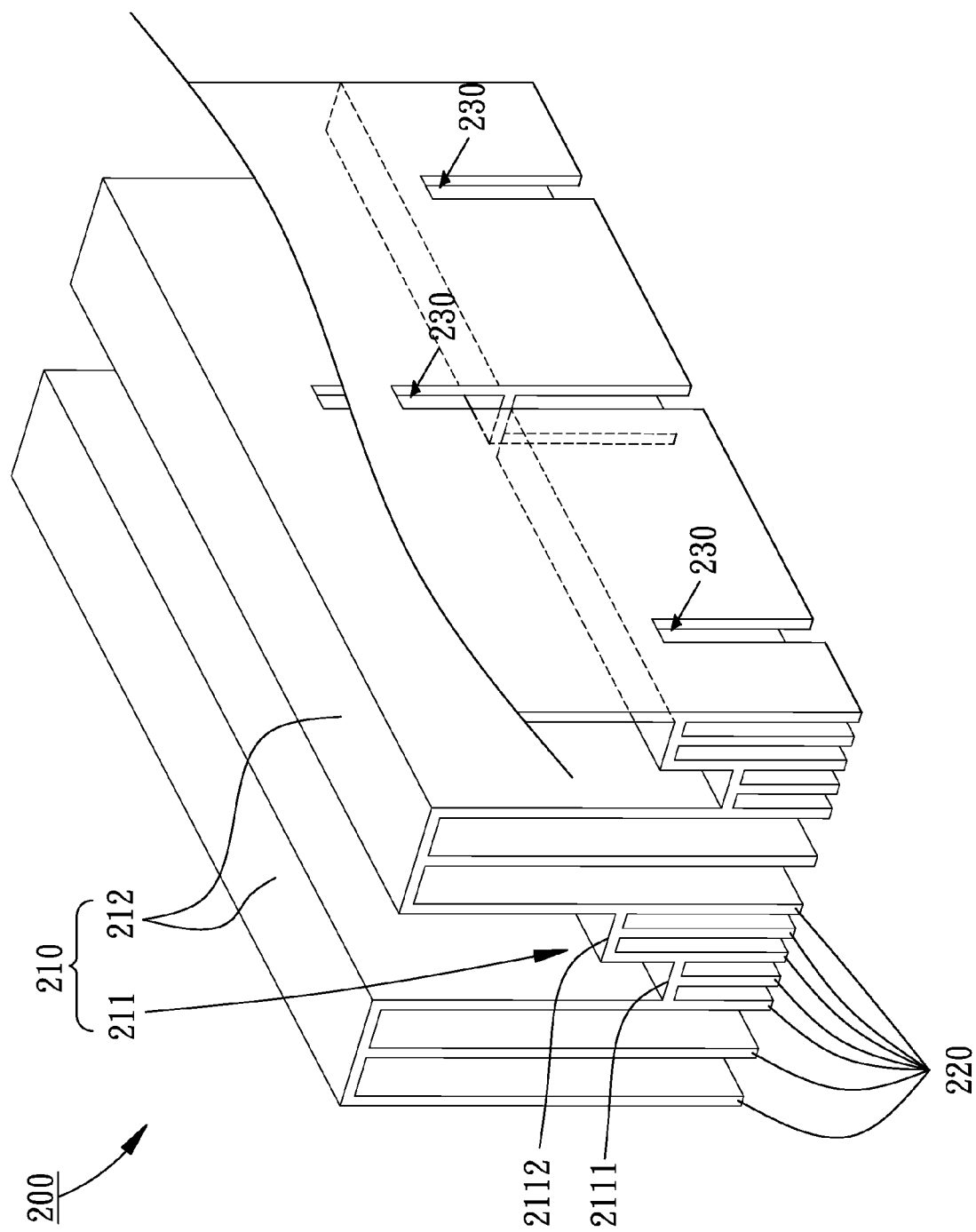
Figure 10:
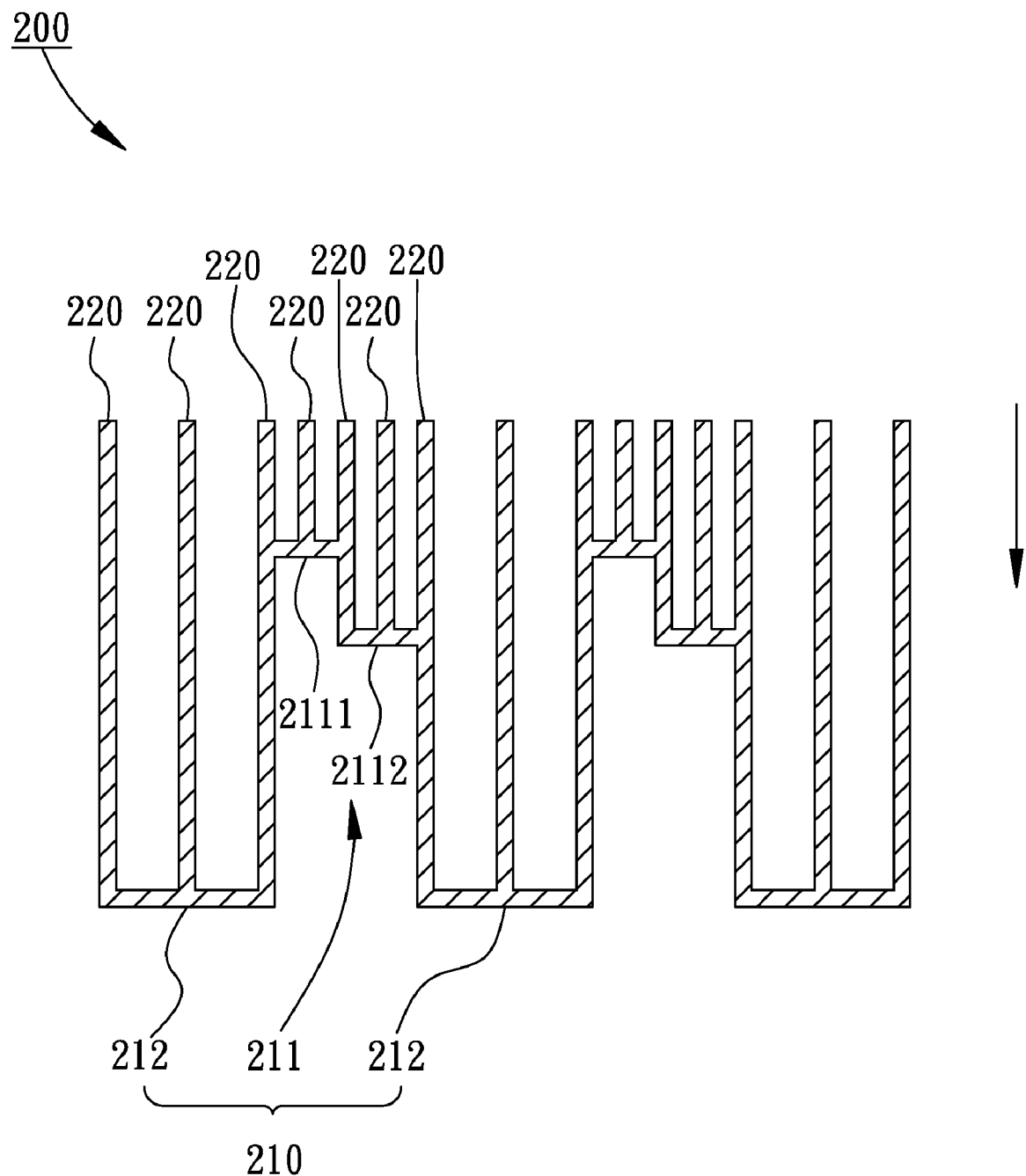
FIGS. 10 and 11 are cross-sectional views of the second embodiment.
Figure 11:
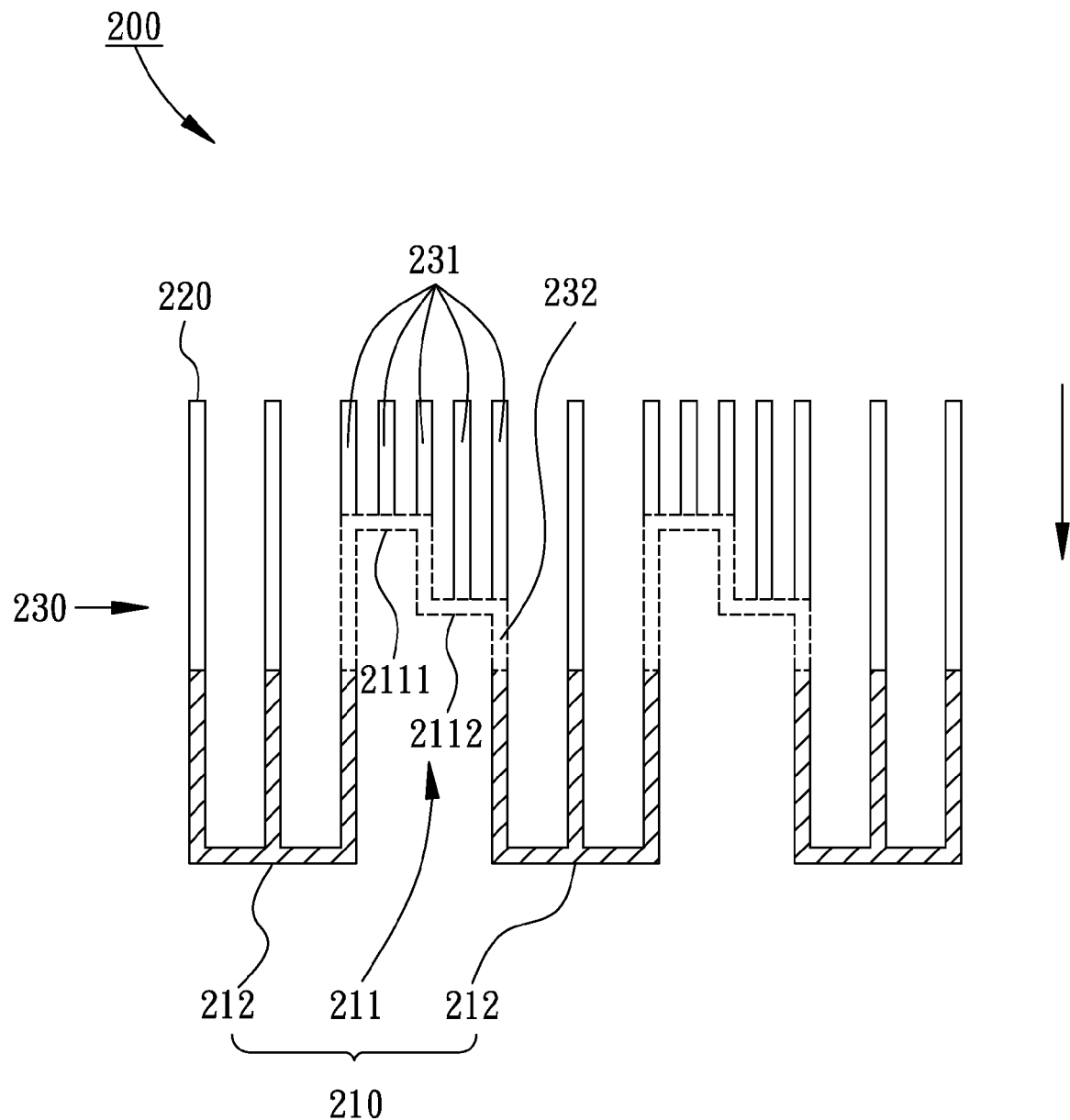

Referring to FIG. 7, the heat dissipating structure 100 can be fabricated into an enclosed or semi-enclosed casing. For example, the heat dissipating structure 100 is fabricated into a tubular structure surrounded by a plate and used as a casing of an electronic apparatus. In the heat dissipating structure 100, heat is absorbed through the inner side face of the extrudate 110, and dissipated through the outer surface thereof and the fins 120. Meanwhile, the cut-through slots 132 allow the air flows to directly pass through the heat dissipating structure 100, thus enhancing the heat dissipation effect.

FIGS. 8, 9, 10, and 11 a heat dissipating structure 200 according to a second embodiment of the present invention is shown. The heat dissipating structure 200 includes an extrudate 210 and a plurality of fins 220, wherein the extrudate 210 and the fins 220 are monolithically formed by extrusion molding. The extrudate 210 includes a plurality of bent portions 211 and a plurality of connecting portions 212 disposed alternately, and the bent portions 211 and connecting portions 212 extend in a longitudinal direction. The connecting portions 212 are provided for connecting the adjacent bent portions 211, and the bent portions 211 protrude from a surface of the extrudate 210. The bent portion 211 includes a first protruding portion 2111 and a second protruding portion 2112 adjacent to each other on the cross-section, wherein the height of the first protruding portion 2111 protruding from the connecting portions 212 is larger than that of the second protruding portion 2112 protruding from the connecting portions 212. The fins 220 are disposed in parallel with the bent portions 211, and are respectively disposed on the bent portions 211 and the connecting portions 212. The fins 220 on the bent portions 211 are disposed on the first protruding portions 2111, or the second protruding portions 2112.

Figure 12:
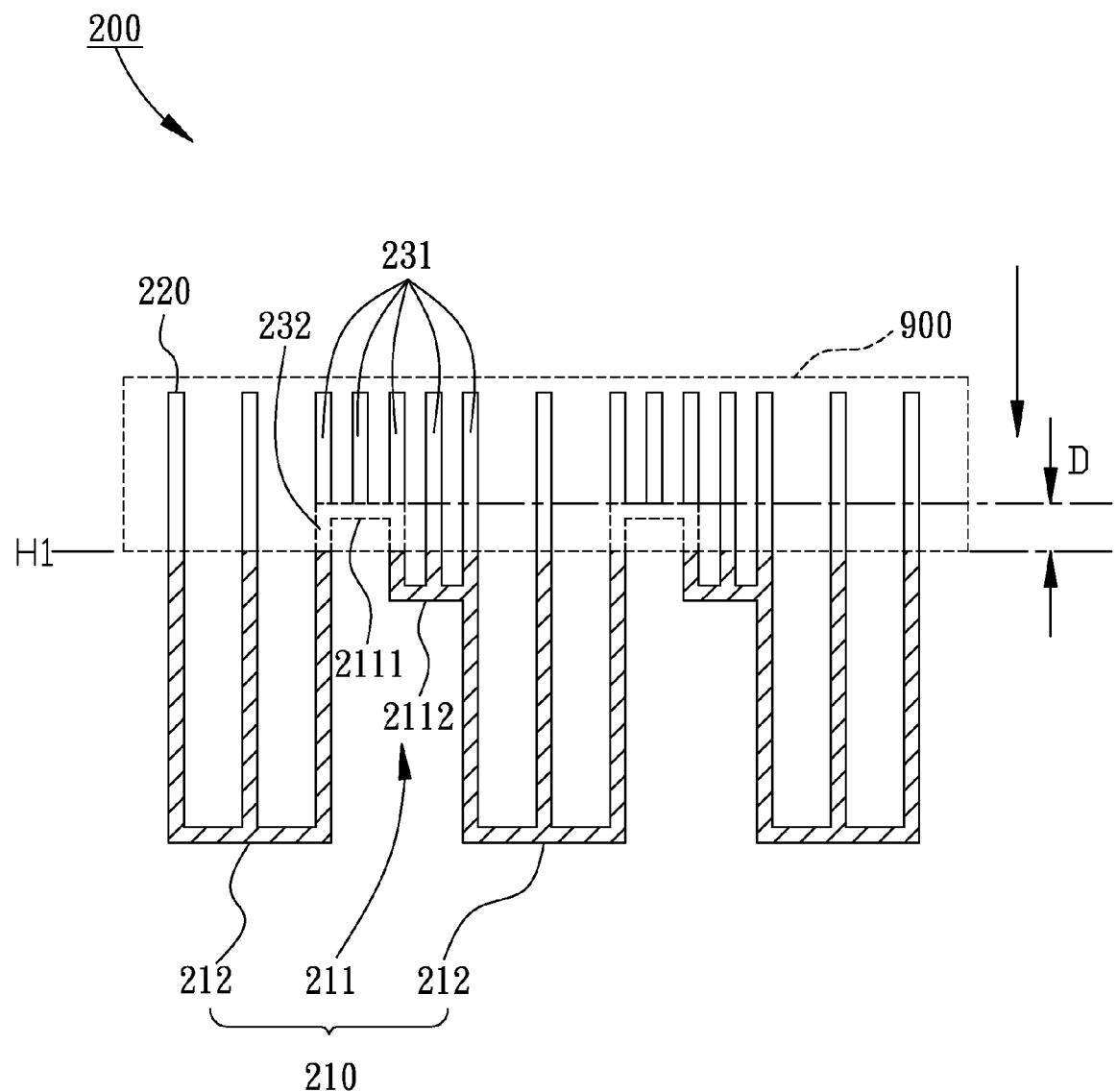
FIGS. 12 and 13 are cross-sectional views of the second embodiment of the present invention, showing steps of forming the heat dissipating structure.
Figure 13:
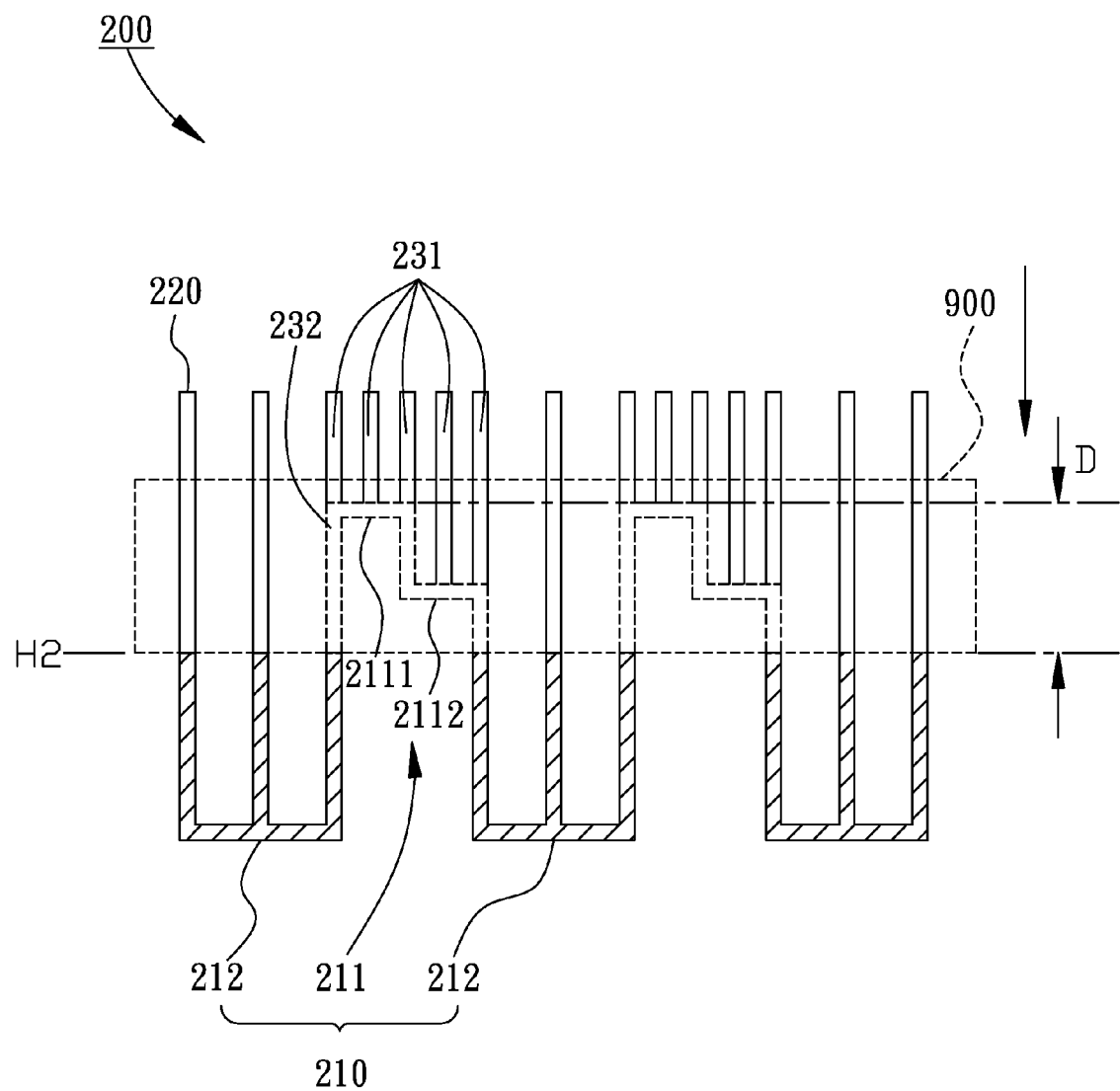
Figure 14:
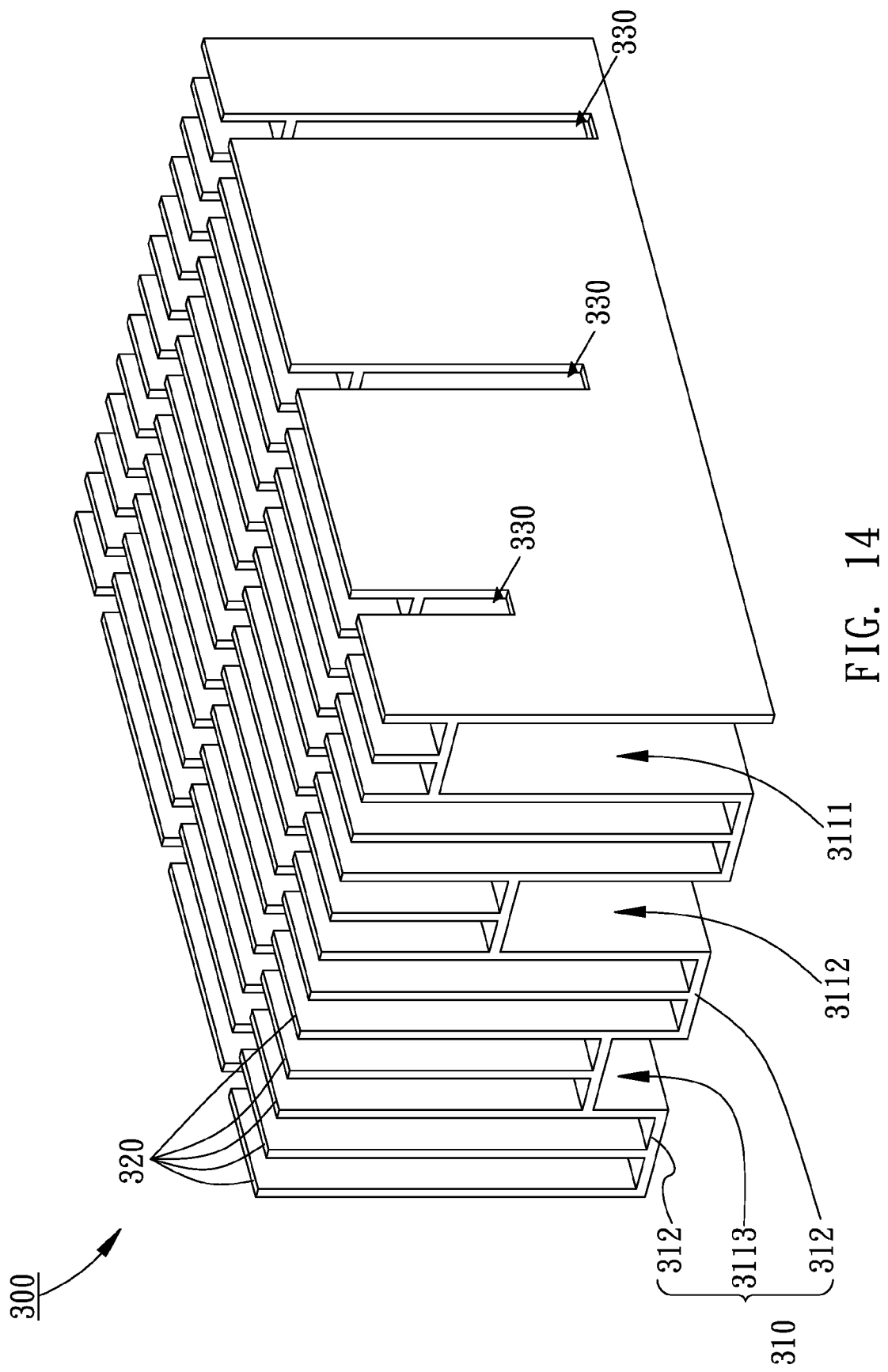
FIGS. 14 and 15 are perspective views of a heat dissipating structure according to a third embodiment of the present invention.
Figure 15:
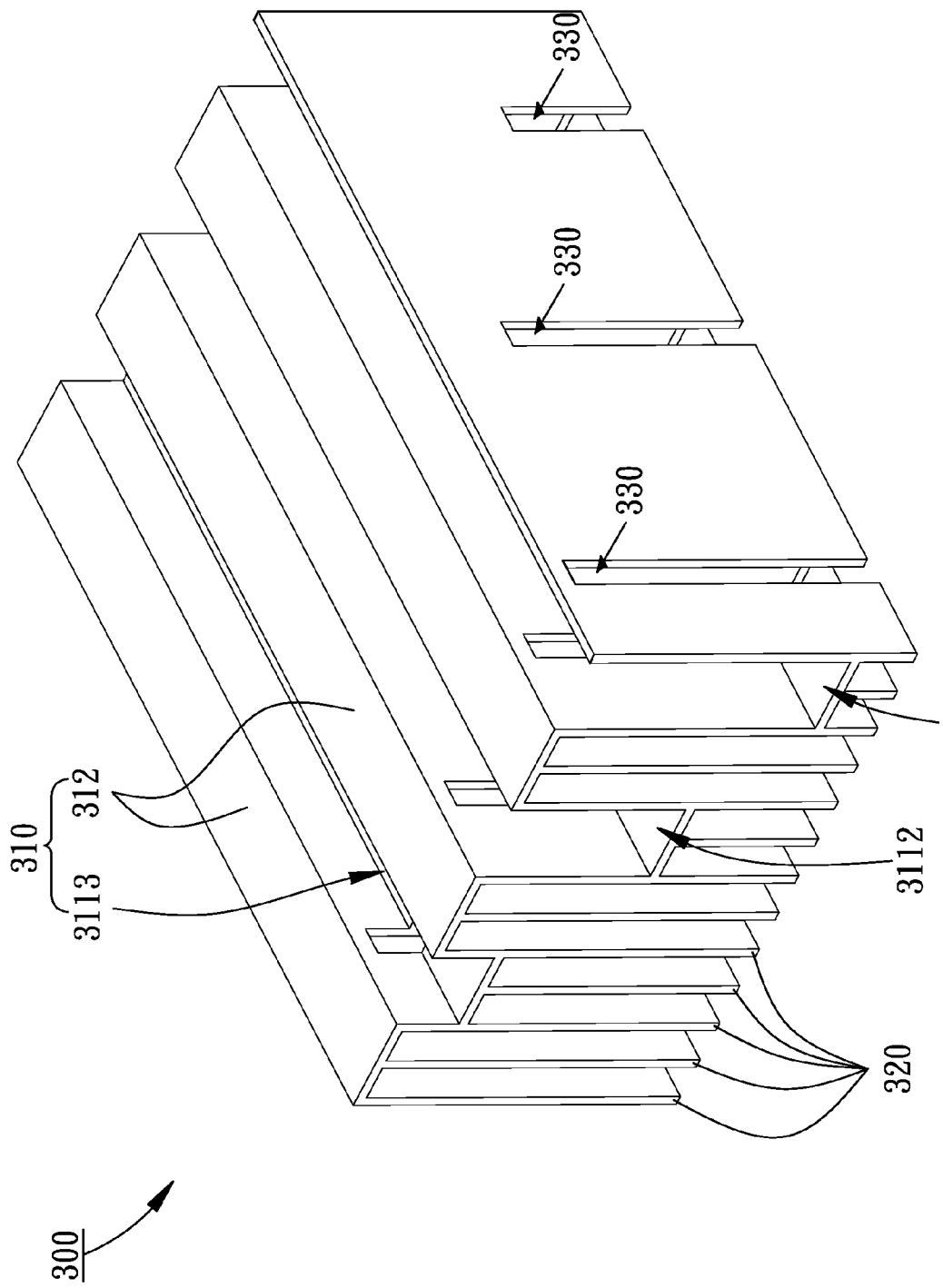
Figure 16:
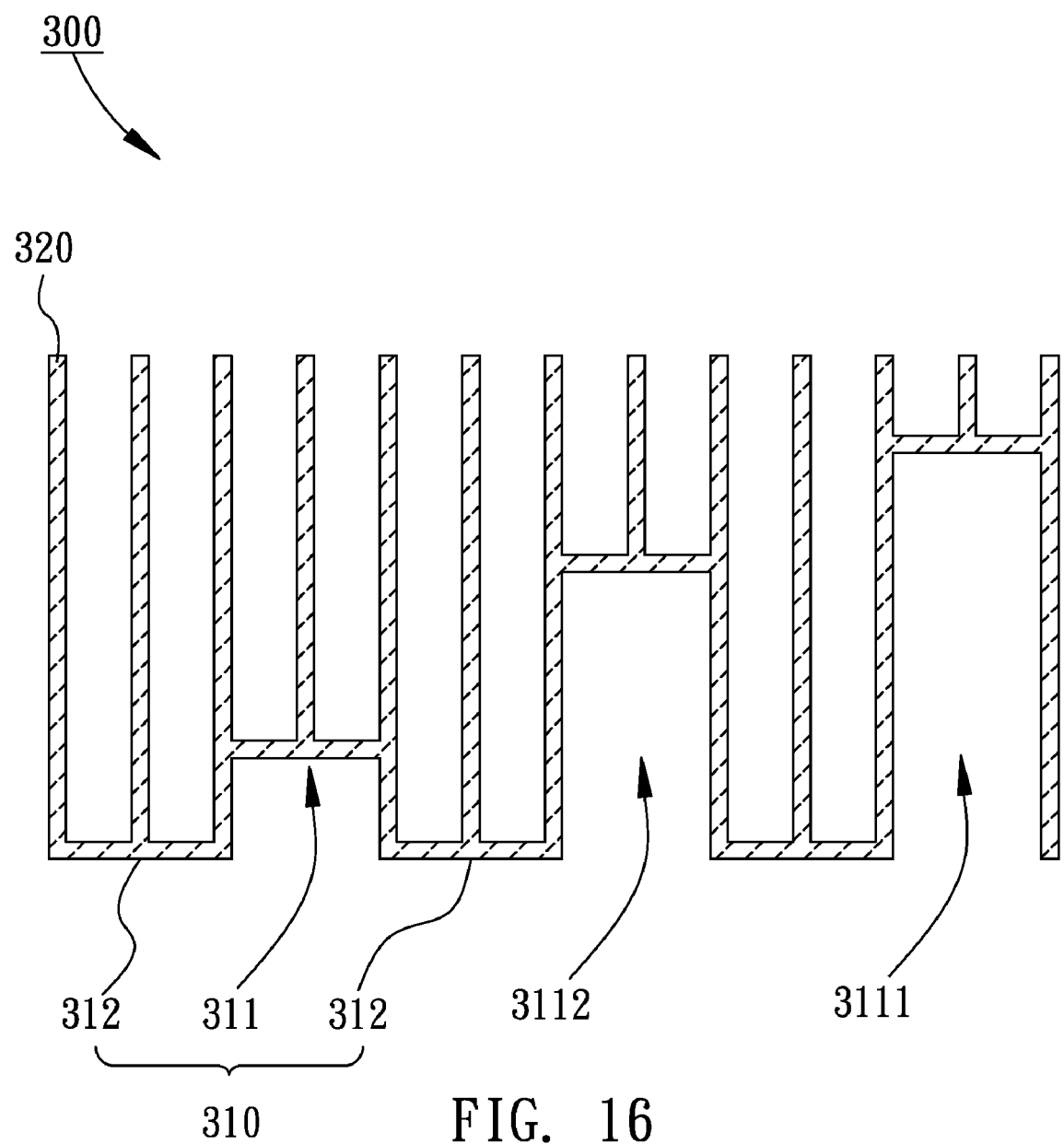
FIGS. 16 and 17 are cross-sectional views of the third embodiment.
Figure 17:
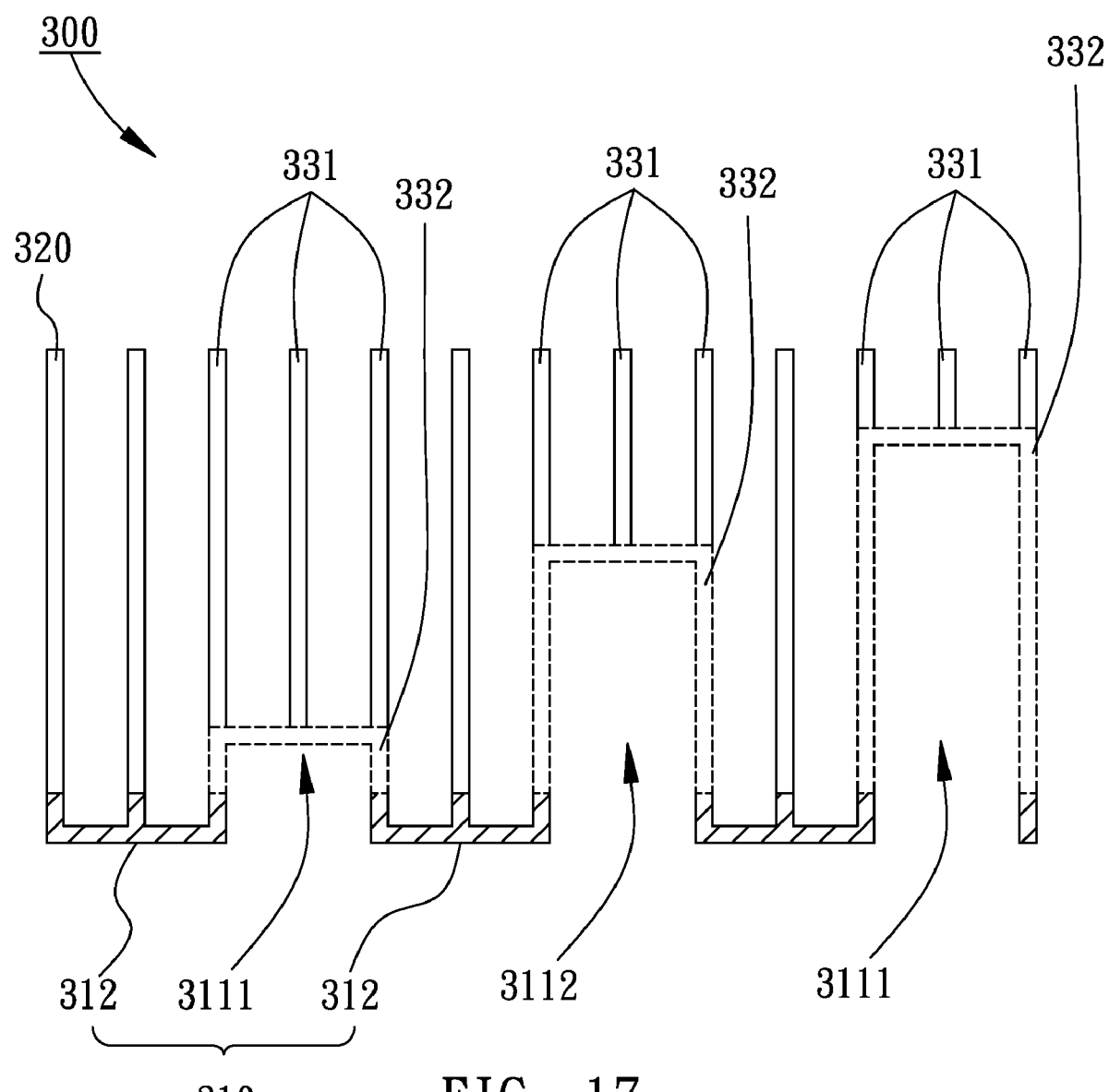

Referring to FIGS. 12 and 13, the heights of the cutting lines of cut channels 230 determine whether cut-through slots 232 can be formed as well as cutting depths D of the formed cut-through slots 232. In the second embodiment, the heights of the cutting lines further determine the range of forming the cut-through slots 232.

Referring to FIG. 12, when reaching a first cutting line H1, the edge of the cutting tool 900 is located between the top edges of the first protruding portions 2111 and the second protruding portions 2112, and only the first protruding portions 2111 is cut by the cutting tool 900. At this point, the cut-through slots 232 are formed on the first protruding portions 2111.

Referring to FIG. 13, when reaching a second cutting line H2, the edge of the cutting tool 900 passes through the top edges of the first protruding portions 2111 and the second protruding portions 2112, and both the first protruding portions 2111 and the second protruding portions 2112 are cut. At this point, the cut-through slots 232 are formed on the first protruding portions 2111 and further extend to the second protruding portions 2112, thereby enhancing the overall porosity of the cut-through slots 232.

Referring to FIGS. 14, 15, 16, and 17, a heat dissipating structure 300 according to a third embodiment of the present invention is shown. The heat dissipating structure 300, similar to that of the first embodiment, includes an extrudate 310 and a plurality of fins 320, wherein the extrudate 310 and the fins 320 are formed monolithically. The extrudate 310 includes a plurality of bent portions and a plurality of connecting portions 312 disposed alternately, and the bent portions and the connecting portions 312 extend in a longitudinal direction of the extrudate 310. The connecting portions 312 are provided for connecting the adjacent bent portions, and the bent portions protrude from a surface of the extrudate 310. The heights of the bent portions protruding from the connecting portions 312 are unequal. The fins 320 are in parallel with the bent portions, and are respectively disposed on the bent portions and the connecting portions 312.

Figure 18:
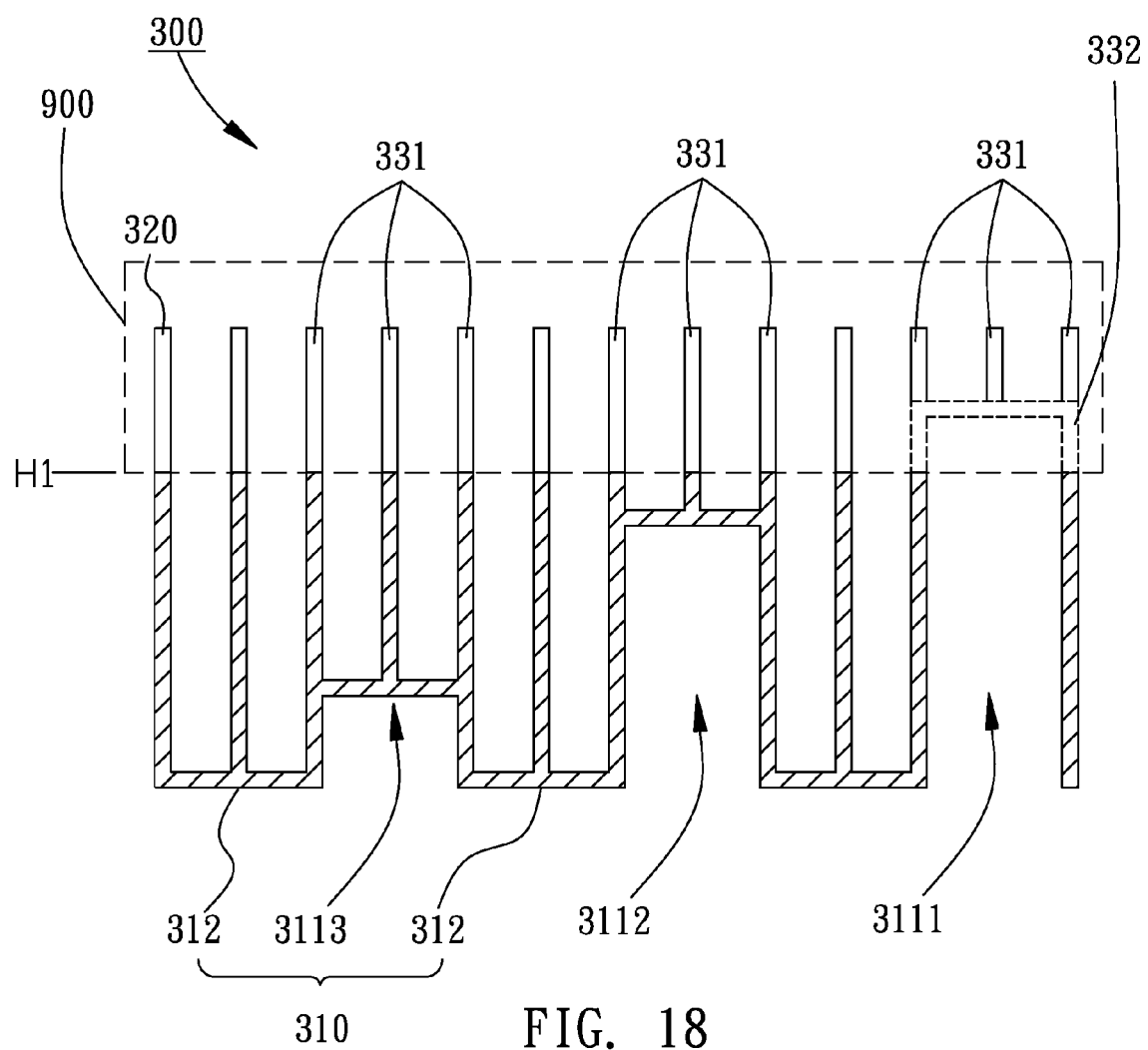
FIGS. 18, 19, and 20 are cross-sectional views of the third embodiment of the present invention, showing steps of forming the heat dissipating structure.
Figure 19:
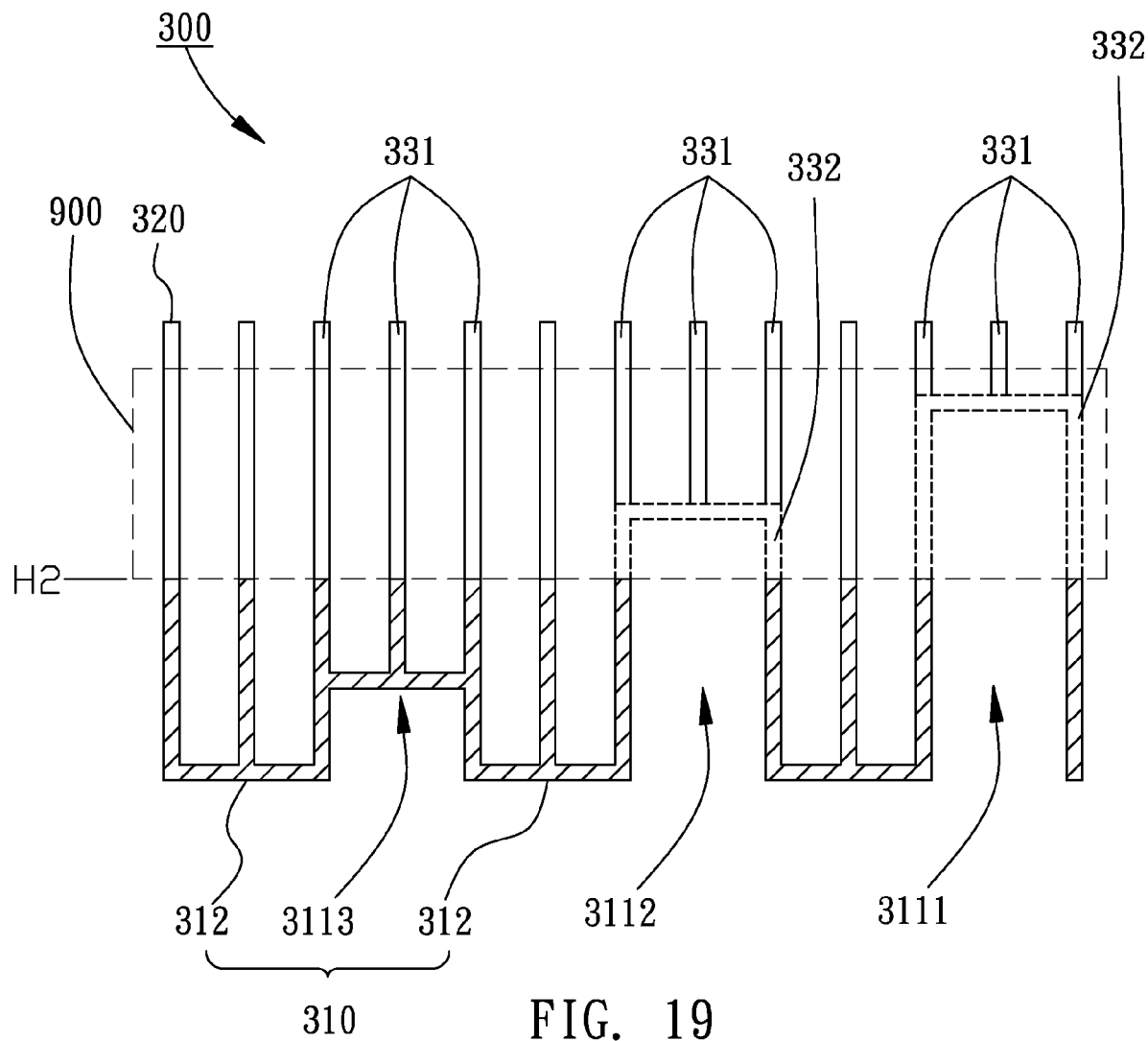
Figure 20:
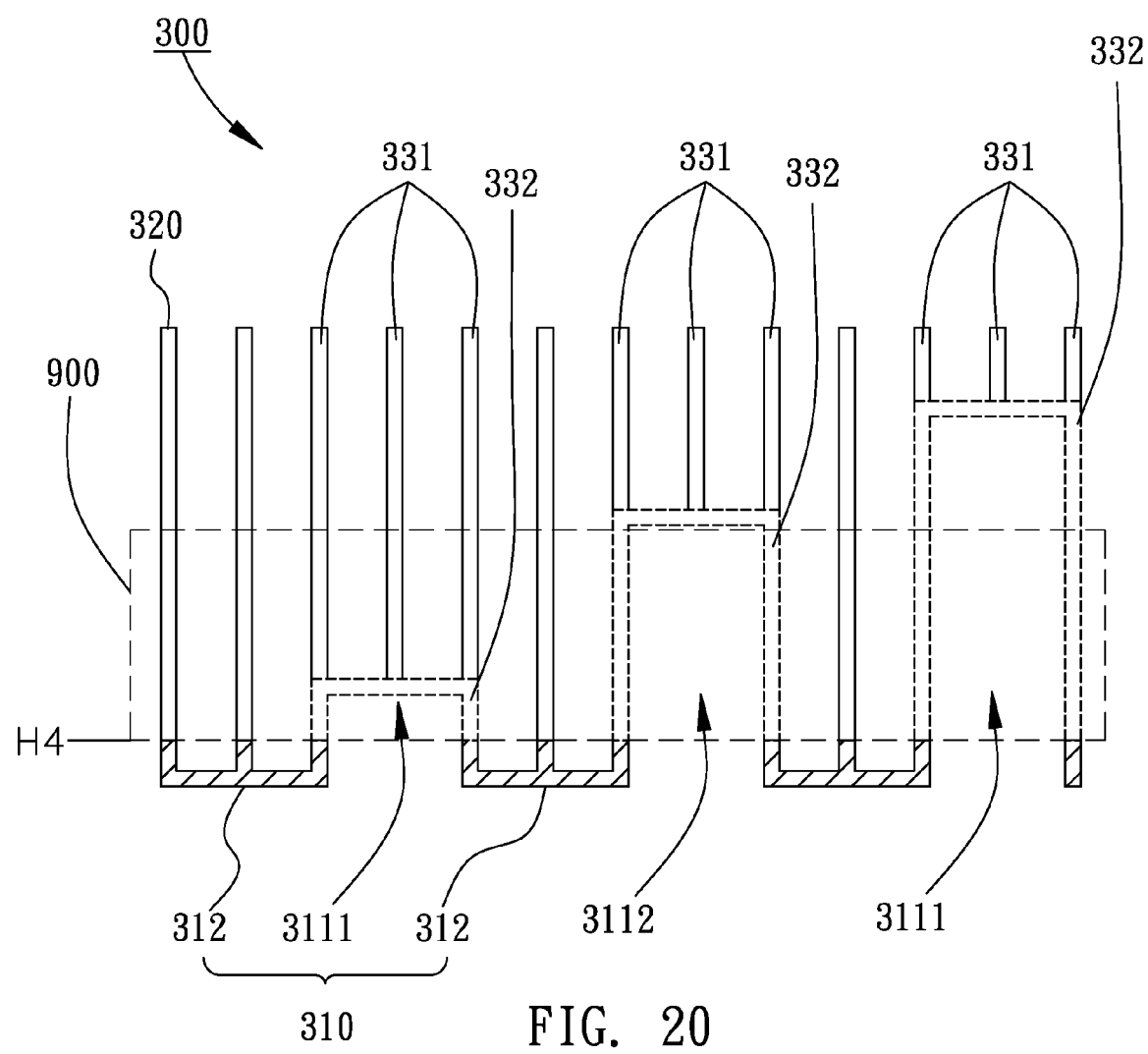

Referring to FIGS. 18, 19, and 20, the heights of the cutting lines of cut channels 330 determine whether cut-through slots 332 are formed at the bent portions by the cutting tool 900 as well as the cutting depths of the cut-through slots 332. The heights of the bent portions are unequal. When the cutting tool 900 is fed toward the surface of the extrudate 310, the fins 320 are cut at first, then the bent portions having relative higher height are cut to form the cut-through slots 332, and afterward the bent portions 311 having relative lower height are cut. In the third embodiment, the bent portions at least include a first bent portion 3111, a second bent portion 3112, and a third bent portion 3113. The first bent portion 3111, the second bent portion 3112, and the third bent portion 3113 are designated for illustration, instead of limiting the number of the bent portions.

Referring to FIG. 18, when the cutting tool 900 is continuously fed to make the cutting depths of the cut channels 330 reach a first cutting line H1, in addition to forming the notches 331 on the fins 320, only the first bent portion 3111, on which has the highest height, is cut to form cut-through slots 332.

Referring to FIG. 19, when the cutting tool 900 is continuously fed to make the cutting depths of the cut channels 330 reach a second cutting line H2, the cut channels 330 simultaneously penetrate the first bent portion 3111 and the second bent portion 3112 to form the cut-through slots 332.

Referring to FIG. 20, when the cutting tool 900 is continuously fed to make the cutting depths of the cut channels 330 reach a third cutting line H3, the first bent portion 3111, the second bent portion 3112, and the third bent portion 3113 are all cut to form the cut-through slots 332.

In the present invention, it is not necessary for forming cut-through slots at all the bent portions. Whether the cut-through slots are formed or not depends on the cutting depths of the cut channels and the heights of the bent portions. According to the third embodiment, the number of the cut-through slots to be formed is determined by the cutting depths and the height differences of the bent portions.

In the first to the third embodiment, the cross-sectional area of the bent portions are approximately rectangular (in the first and third embodiments) or a combination of a plurality of rectangles (in the second embodiment). However, the cross-sectional areas of the bent portions are not limited to be rectangular, but can be of any shape protruding from the extrudate. The shape of the cross-sectional area of the bent portion is determined according to the consideration whether it can be easily extrusion-molded.

Figure 21:
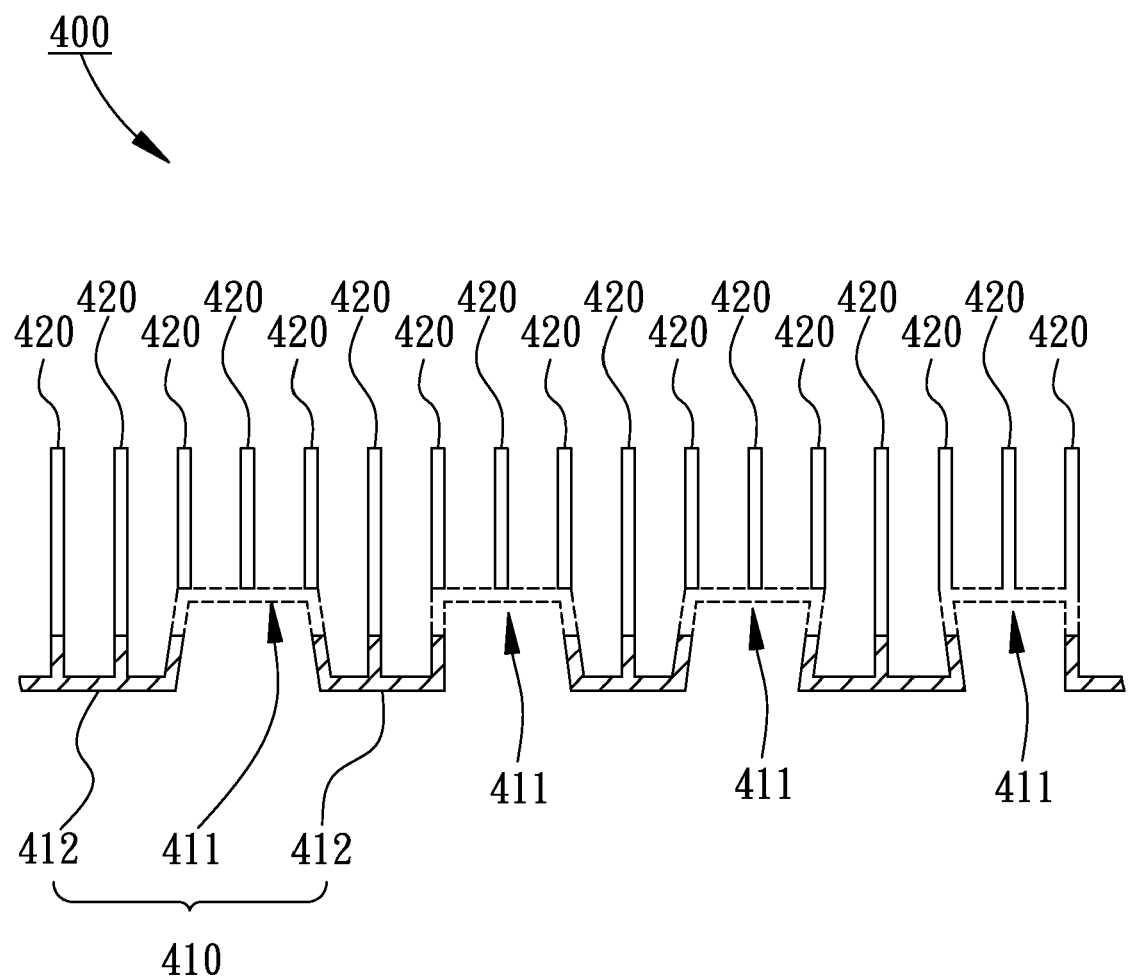
FIG. 21 is a cross-sectional view of a fourth embodiment of the present invention.

Referring to FIG. 21, a heat dissipating structure 400 according to a fourth embodiment of the present invention is shown. The heat dissipating structure 400 includes an extrudate 410 and a plurality of fins 420, wherein the extrudate 410 and the fins 420 are monolithically formed. The extrudate 410 includes a plurality of bent portions 411 and a plurality of connecting portions 412, the bent portion 411 and connecting portion 412 are disposed alternately and extend in a longitudinal direction of the extrudate 410. The connecting portions 412 are provided for connecting the adjacent bent portions 411, and the bent portions 411 protrude from a surface of the extrudate 410. The fins 420 are disposed in parallel with the bent portions 411, and are respectively disposed on the bent portions 411 and the connecting portions 412. In the fourth embodiment, the cross-sectional areas of the bent portions 411 are quadrangular of any form.

Figure 22:
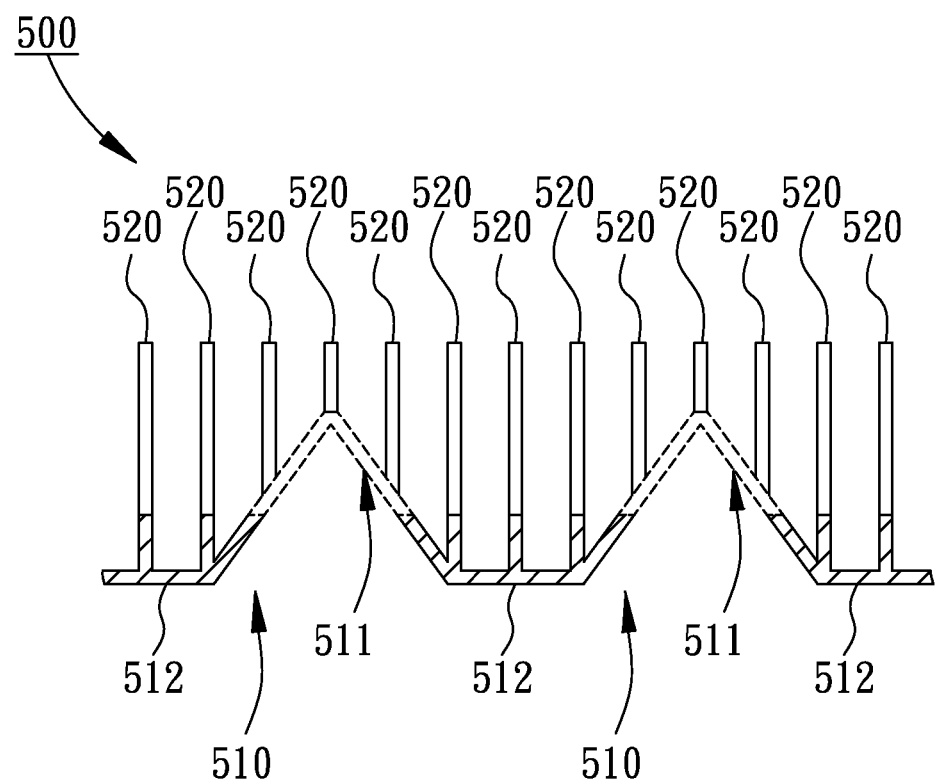
FIG. 22 is a cross-sectional view of a fifth embodiment of the present invention.
Figure 23:
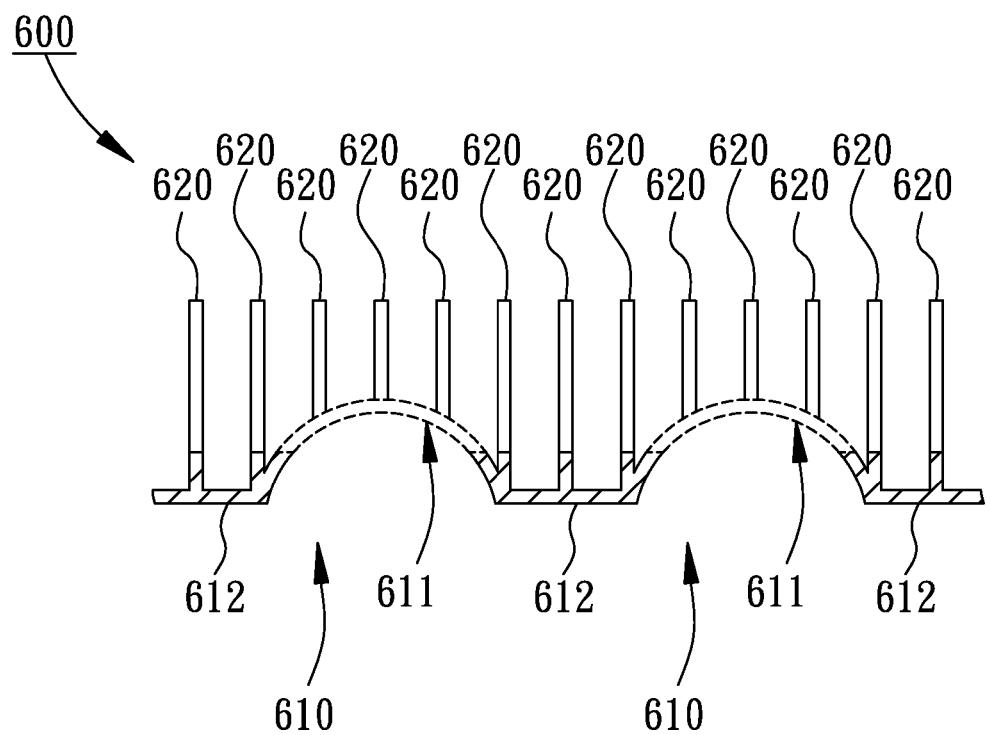
FIG. 23 is a cross-sectional view of a sixth embodiment of the present invention.

Referring to FIGS. 22 and 23, a heat dissipating structure 500 according to a fifth embodiment and a heat dissipating structure 600 according to a sixth embodiment of the present invention are shown. The heat dissipating structure 500, 600 includes an extrudate 510, 610 and a plurality of fins 520, 620, wherein the extrudates 510, 610 are monolithically formed with the fins 520, 620. The extrudate 510, 610 includes a plurality of bent portions 511, 611 and a plurality of connecting portions 512, 612. In the fifth and sixth embodiments, the cross-sectional areas of the bent portions 511 and 611 are respectively arc-shaped and triangular.

Figure 24:
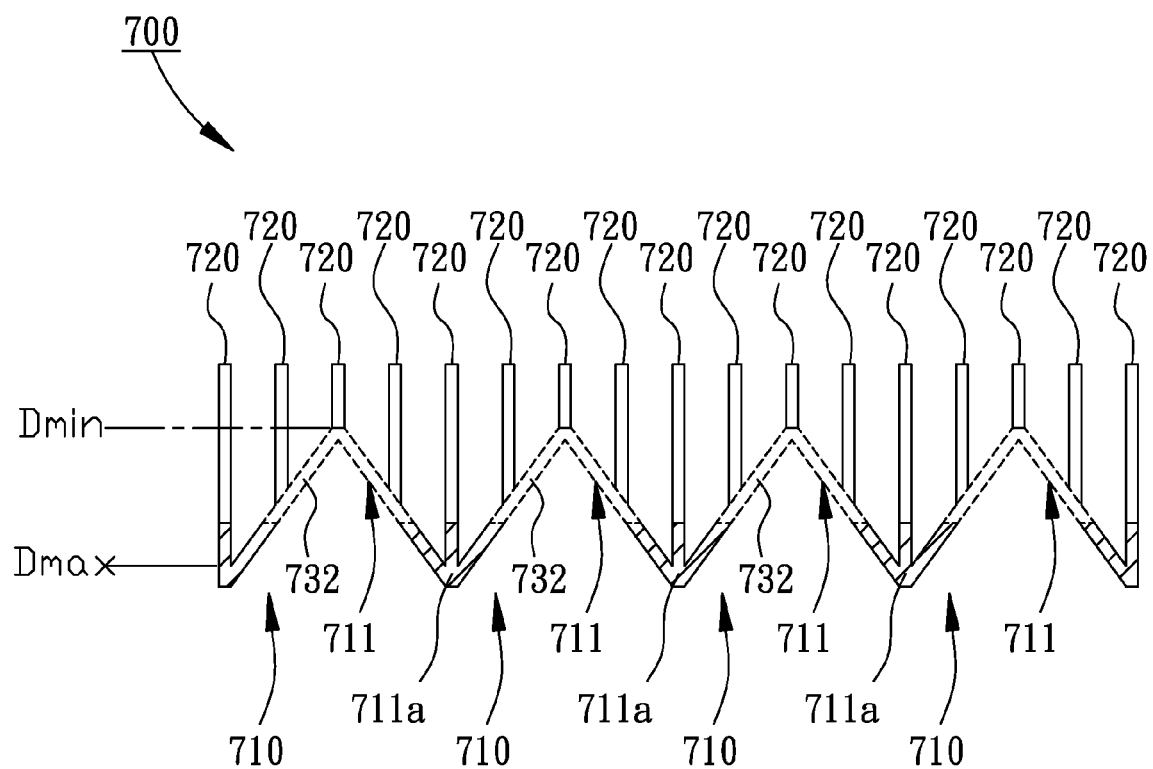
FIG. 24 is a cross-sectional view of a seventh embodiment of the present invention.

Referring to FIG. 24, a heat dissipating structure 700 according to a seventh embodiment of the present invention is shown. The heat dissipating structure 700 includes an extrudate 710 and a plurality of fins 720, wherein the extrudate 710 and the fins 720 are monolithically formed. The extrudate 710 includes a plurality of protruding bent portions 711 in parallel with each other. The cross-sectional areas of the bent portions 711 are triangular.

The adjacent bent portions 711 are connected to each other at edges. The fins 720 are formed on the bent portions 711, or on joining portions between the adjacent bent portions 711. Therefore, when the cutting tool is used to form cut channels, junctions 711a between the adjacent bent portions 711 are required to be reserved. A minimum cutting line Hmin is defined at the highest point of the inner surface of the bent portions 711, and a maximum cutting depth Hmax is defined at the lowest point of the outer surfaces of the bent portions 711. The cutting lines for the cutting tool to cut the bent portions 711 lies between the minimum cutting depth Hmin and the maximum cutting depth Hmax, such that cut-through slots 732 are formed on the bent portions 711 without cutting off the junctions 711a between the adjacent bent portions 711.

Figure 25:
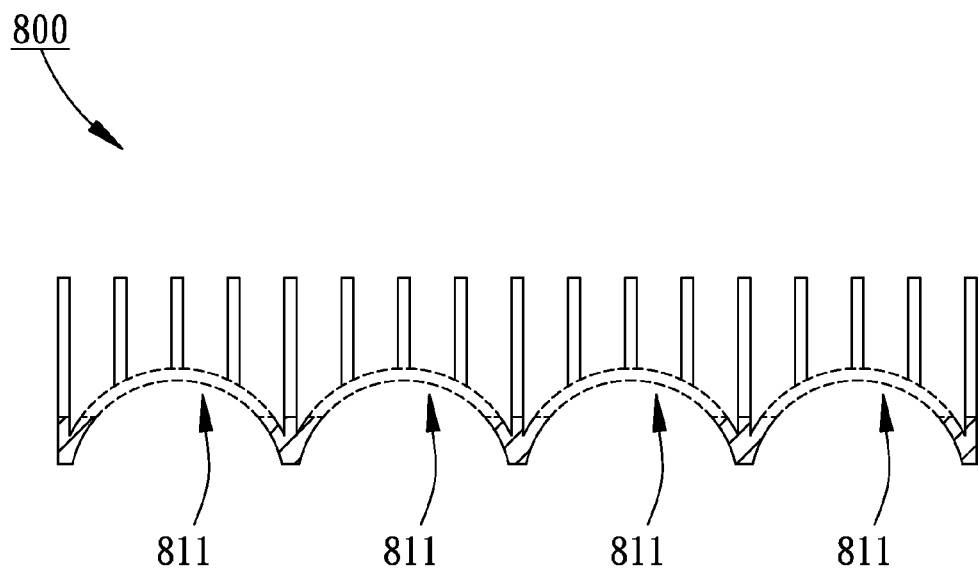
FIG. 25 is a cross-sectional view of an eighth embodiment of the present invention.

Referring to FIG. 25, a heat dissipating structure 800 according to an eighth embodiment of the present invention is shown. The heat dissipating structure 800 is similar to that of the seventh embodiment, and only differs in that the cross-sectional areas of the bent portions 811 of the eighth embodiment are arc-shaped.

Additional advantages and modifications will readily occur to those proficient in the relevant fields. The invention in its broader aspects is therefore not limited to the specific details and representative embodiments shown and described herein. Accordingly, various modifications may be made without departing from the spirit or scope of the general inventive concept as defined by the appended claims and their equivalents.

What is claimed is:

1. A heat dissipating structure, comprising:
   an extrudate, including a plurality of protruding bent portions extending externally in parallel and a plurality of connecting portions for connecting the adjacent bent portions, wherein the bent portions are of substantially uniform thickness and the connecting portions are of substantially uniform thickness;
   a plurality of fins, extending in parallel with the bent portions, at least one of the fins being disposed on each of the bent portions and at least one of the fins being disposed on each of the connecting portions; and
   at least one cut channel, including a notch forming on at least one of the fins and a cut-through slot forming on at least one of the bent portions, wherein the notch and the cut-through slot of the cut channel are coplanar.

2. The heat dissipating structure as claimed in claim 1, wherein a cut depth of each of the cut-through slots is smaller than the height of each of the bent portions protruding from the connecting portions.

3. The heat dissipating structure as claimed in claim 1, wherein the bent portion comprises a first protruding step and a second protruding step, and a height of the first protruding step is larger than that of the second protruding step.

4. The heat dissipating structure as claimed in claim 3, wherein the cut-through slots are formed at the first protruding steps.

5. The heat dissipating structure as claimed in claim 3, wherein the cut-through slots are formed at the first protruding steps and further extend to the second protruding steps.

6. The heat dissipating structure as claimed in claim 1, wherein the heights of the bent portions protruding from the connecting portions are unequal.

7. The heat dissipating structure as claimed in claim 1, wherein a cross-sectional shape of each of the bent portions is selected from a group consisting of triangular, arc, and U-shaped.

8. A heat dissipating structure as claimed in claim 1 wherein each of the fins comprises a first end which is attached to a bent portion or a connecting portion.

9. A heat dissipating structure as claimed in claim 8 wherein each of the fins comprises a second end and wherein all of the second ends are coplanar.

* * * * *